(12) United States Patent
Kim

(10) Patent No.: US 12,344,932 B2
(45) Date of Patent: Jul. 1, 2025

(54) DEPOSITION OF CERAMIC LAYERS USING LIQUID ORGANOMETALLIC PRECURSORS

(71) Applicant: X-ENERGY, LLC, Rockville, MD (US)

(72) Inventor: Howard Taery Kim, Knoxville, TN (US)

(73) Assignee: X-Energy, LLC, Rockville, MD (US)

( * ) Notice: Subject to any disclaimer, the term of this patent is extended or adjusted under 35 U.S.C. 154(b) by 85 days.

(21) Appl. No.: 18/157,248

(22) Filed: Jan. 20, 2023

(65) Prior Publication Data

US 2023/0295796 A1 Sep. 21, 2023

Related U.S. Application Data

(60) Provisional application No. 63/301,656, filed on Jan. 21, 2022.

(51) Int. Cl.
| | |
|---|---|
| *C23C 16/32* | (2006.01) |
| *C23C 16/442* | (2006.01) |
| *C23C 16/448* | (2006.01) |
| *G21C 3/62* | (2006.01) |

(52) U.S. Cl.
CPC ............ *C23C 16/32* (2013.01); *C23C 16/442* (2013.01); *C23C 16/4481* (2013.01); *G21C 3/626* (2013.01)

(58) Field of Classification Search
None
See application file for complete search history.

(56) References Cited

U.S. PATENT DOCUMENTS

| | | | | |
|---|---|---|---|---|
| 4,267,019 | A * | 5/1981 | Kaae | G21C 3/626 976/DIG. 97 |
| 6,743,473 | B1 * | 6/2004 | Parkhe | H01L 21/76862 427/249.1 |
| 2010/0062614 | A1 * | 3/2010 | Ma | H01L 21/28562 438/785 |
| 2010/0298125 | A1 * | 11/2010 | Kim | B01J 37/06 502/185 |
| 2011/0052805 | A1 * | 3/2011 | Bordere | C01B 32/168 427/217 |

* cited by examiner

*Primary Examiner* — Binh X Tran
*Assistant Examiner* — Bradford M Gates
(74) *Attorney, Agent, or Firm* — Kramer & Amado, P.C.

(57) ABSTRACT

A metal or ceramic layer may be deposited on nuclear materials by chemical vapor deposition using a non-halogenated liquid organometallic metal precursor. The chemical vapor deposition is carried out by a method including steps of introducing nuclear fuel particles into a fluidized bed reactor, and heating the fluidized bed reactor to a desired operating temperature $T_1$. A flow of a carrier gas is initiated through a vaporizer, and the non-halogenated liquid organometallic metal precursor is injected into the vaporizer and vaporized. A first mixture of the carrier gas and the vaporized non-halogenated liquid organometallic metal precursor may be mixed with a gaseous carbon source, a gaseous nitrogen source, a gaseous oxygen source, or a mixture thereof to produce a second mixture; and the second mixture flows into the fluidized bed reactor at operating temperature $T_1$, allowing deposition of a desired ceramic coating on the particles. The non-halogenated liquid organometallic metal precursor may be a compound of Zr, Hf, Nb, Ta, W, V, Ti, or a mixture thereof.

16 Claims, 9 Drawing Sheets

DEPOSITION OF CERAMIC LAYERS USING LIQUID ORGANOMETALLIC PRECURSORS

CROSS-REFERENCE TO RELATED APPLICATIONS

This nonprovisional application claims the benefit of U.S. Provisional Application No. 63/301,656 filed Jan. 21, 2022. The entire disclosure of the prior application is incorporated by reference.

TECHNICAL FIELD

Various exemplary embodiments disclosed herein relate generally to the deposition of ceramic materials using non-halogenated liquid organometallic compounds as metal precursors. Particularly, embodiments disclosed herein relate to chemical vapor deposition of ceramic layers on a solid substrate using non-halogenated liquid organometallic compounds as metal precursors. Also, embodiments disclosed herein relate to chemical vapor infiltration of a ceramic material into a porous or particulate substrate using non-halogenated liquid organometallic compounds as metal precursors.

BACKGROUND

Chemical vapor deposition (CVD) of metal-containing ceramics for nuclear fuel particles has traditionally been performed with metal halides in a fluidized bed reactor. Some halogen-containing metal or metalloid compounds are liquids which are easily delivered into a CVD deposition system. For example, silanes such as $Si(CH_3)_{(4-n)}Cl_n$ are liquids which may be injected into a carrier gas line in a CVD deposition system. However, halides of many metals are high-melting solids, i.e., solids which melt at >200° C., which are not easily delivered into a CVD system. Metal halide deposition sources may also produce toxic halogen-containing gases as side products.

Chemical vapor deposition is used in the manufacture of nuclear fuel particles. Tristructural-isotropic (TRISO) nuclear fuel particles, for example, include two layers of carbon deposited on a nuclear fuel kernel, followed by a layer of silicon carbide (SiC) and an outer layer of dense pyrocarbon (PyC). The SiC layer is typically deposited using methyltrichlorosilane (MTS) or another liquid chlorosilane introduced into a chemical vapor deposition reactor using a carrier gas. While this method works well for deposition of silicon-based ceramic layers, use of chlorides of other metals, e.g., zirconium, hafnium, or tungsten, for chemical vapor deposition is inconvenient because these chlorides are typically high-melting solids.

In view of the foregoing, it would be desirable to develop techniques for deposition of ceramic layers using liquid or low-melting metal-containing precursor gases. In particular, it would be desirable to develop techniques for deposition of ceramic layers using non-halogenated metal-containing precursor gases.

SUMMARY

The present disclosure relates to novel CVD and chemical vapor infiltration (CVI) systems and methods that allow mixing a gaseous carbon, nitrogen, or oxygen precursor with liquid organometallic metal precursors. The resulting mixtures may be delivered into a CVD or CVI reactor, and used to deposit a ceramic layer. Liquid organometallic metal precursors may be delivered with a defined liquid flow rate through a liquid mass flow controller, e.g., a valve such as a ball valve or a needle valve, into a vaporization unit. As a defined flow of liquid flows into a vaporizer, a carrier gas is mixed into the liquid and heated in the vaporization unit at or above the boiling temperature of the liquid. The liquid is vaporized and delivered into a CVD or CVI reaction chamber. The systems and methods disclosed herein can be used to deposit ceramic materials directly onto nuclear fuels. This also allows for chemical metal infiltration of ceramic matrix materials into porous fuel forms, or surface coating of solid fuel forms. The systems and methods disclosed herein thus allow production of structural metal or ceramic nuclear fuels.

Novel organometallic precursors, such as liquid organometallic compounds of zirconium, hafnium, niobium, tantalum, tungsten, titanium, and vanadium, have been identified as useful CVD or CVI metal precursors that can be used for deposition of ceramic materials using the systems and methods disclosed herein. These liquid organometallic compounds may be introduced into CVD or CVI systems or reactors without necessitating complex delivery systems. A technique has been developed to deliver liquid organometallic precursors into a CVD or CVI system using a liquid vaporizer, which saturates a carrier gas for delivery into a chemical reactor. This saturated gas mixture can be delivered directly into a reactor for deposition of a metal layer, or mixed with additional gases, e.g., a gaseous carbon source, a gaseous nitrogen source, and/or a gaseous oxygen source, to produce various ceramic coatings, and or to deposit a ceramic matrix material into a porous material by CVI.

Also, due to the use of halogen-free liquid organometallic compounds as metal precursors for CVD or CVI deposition of a ceramic material, the systems and methods disclosed herein significantly reduce and/or eliminate toxicity and corrosion during deposition of a ceramic layer onto particulate substrates, including nuclear fuel kernels. The systems and methods disclosed herein allow for direct metal ceramic production onto nuclear fuels with increased safety and prevent release of toxic halogen gases into the environment.

Various embodiments disclosed herein relate to a method of depositing a metal or ceramic layer by chemical vapor deposition, by introducing particles to a fluidized bed reactor; heating the fluidized bed reactor to a desired operating temperature $T_1$; and initiating a flow of a carrier gas through a vaporizer. A non-halogenated liquid organometallic metal precursor is introduced into the vaporizer and vaporized. A first mixture of the carrier gas and the vaporized non-halogenated liquid organometallic metal precursor is allowed to leave the vaporizer, and is optionally mixed with a gaseous carbon source, a gaseous nitrogen source, a gaseous oxygen source, or a mixture thereof to produce a second mixture. If the gaseous carbon source, gaseous nitrogen source, or gaseous oxygen source is not used, the first mixture flows into the fluidized bed reactor at operating temperature $T_1$, allowing deposition of a desired metal coating on the particles. Alternatively, the second mixture containing a carbon, nitrogen, or oxygen source flows into the fluidized bed reactor at operating temperature $T_1$, allowing deposition of a desired ceramic coating on the particles.

In various embodiments disclosed herein, the step of introducing particles to a fluidized bed reactor includes introducing particles which are nuclear fuel kernels. The particles may be nuclear fuel kernels selected from the group consisting of oxides, carbides, oxycarbides, and nitrides of a metal selected from the group consisting of uranium, plutonium, and thorium. The particles may be nuclear fuel kernels selected from the group consisting of uranium oxides, uranium carbide, uranium nitrides, uranium oxycarbide, and mixtures thereof.

In various embodiments, each particle comprises a nuclear fuel kernel and at least one carbon layer on the kernel. Each nuclear fuel kernel may have multiple carbon layers, including, for example, a porous carbon buffer layer on the kernel, and a dense layer of pyrolytic carbon on the buffer layer.

In various embodiments, each particle comprises a nuclear fuel kernel and at least one ceramic layer on the kernel. Each nuclear fuel kernel may have multiple ceramic layers, e.g., layers of a metal oxide, a metal carbide, a metal nitride, a metal oxycarbide, or an alloy thereof.

In various embodiments of the method of depositing a metal or ceramic layer by chemical vapor deposition, the second mixture containing a carbon, nitrogen, or oxygen source flows into the fluidized bed reactor at operating temperature $T_1$, allowing deposition of a desired ceramic coating on the particles. Such a method may further include steps of:
  depositing an inner carbon layer on the nuclear fuel kernels, prior to introducing the non-halogenated liquid organometallic metal precursor into the vaporizer; and
  depositing an outer carbon layer on the desired ceramic coating.

The non-halogenated liquid organometallic metal precursor may be a compound of a metal selected from the group consisting of Zr, Hf, Nb, Ta, W, V, Ti, and a mixture thereof. The metal in the non-halogenated liquid organometallic metal precursor may be bound to an alkoxide group, an amino group, an imino group, or a combination thereof.

In various embodiments, the non-halogenated liquid organometallic metal precursor has a formula $M^{+n}L_n$, $M^{+n}L^1_{(n-m)}L^2_{(m)}$, or $(L^3=)_pM^{+n}L_{(n-2p)}$, wherein:
  M is Zr, Hf, Nb, Ta, W, V, Ti, or a mixture thereof;
  L and $L^1$ are independently selected from C1-C4 alkyl groups, C1-C4 alkoxy groups, bis(C1-C4 dialkyl) amido groups, or a combination thereof;
  $L^2$ is a cyclopentadienyl anion;
  $L^3$ is O= or RN=, wherein R is alkyl;
  m is 1 or 2,
  p is 1 or 2; and
  the valency of the metal M is n.

The non-halogenated liquid organometallic metal precursor may be:
  a metal alkoxide selected from the group consisting of titanium(IV) isopropoxide, titanium(IV) isobutoxide, hafnium(IV) butoxide, niobium(V) t-butoxide, niobium(III) t-butoxide, and zirconium(IV) butoxide; or
  a metal amine selected from the group consisting of:
    (tert-butylimino)tris(diethylamino)tantalum(V);
    (tert-butylimino)tris(diethylamino)niobium(V);
    (tert-butylimino)tris(methylethylamino)niobium(V);
    tris(diethylamino)niobium(III);
    tris(methylethylamino)niobium(III);
    tris(diethylamino)niobium(III);
    tris(dimethylamino)cyclopentadienyl zirconium(IV);
    tetrakis(isopropylmethylamino)zirconium(IV);
    tetrakis(ethylmethylamino)zirconium(IV);
    tetrakis(diethylamino)zirconium(IV);
    tris(dimethylamino)cyclopentadienyl hafnium(IV);
    bis(methylimino)bis(dimethylamino)tungsten(VI); and
    bis(tert-butylimino)bis(dimethylamino)tungsten(VI).

In various embodiments, the second mixture contains a carbon, nitrogen, or oxygen source. The second mixture may contain a gaseous carbon source; and the second mixture may flow into the fluidized bed reactor, allowing deposition of a desired metal carbide coating on the particles. The second mixture may contain a gaseous nitrogen source; and the second mixture may flow into the fluidized bed reactor, allowing deposition of a desired metal nitride coating on the particles. The second mixture may contain a gaseous oxygen source; and the second mixture may flow into the fluidized bed reactor, allowing deposition of a desired metal oxide coating on the particles.

Various embodiments disclosed herein relate to a method of providing a porous mass with a metal or ceramic matrix by chemical vapor infiltration. The method includes steps of:
  introducing the porous mass into to a chemical vapor infiltration reactor;
  heating the chemical vapor infiltration reactor to a desired operating temperature $T_1$;
  initiating a flow of a carrier gas through a vaporizer;
  injecting a non-halogenated liquid organometallic metal precursor into the vaporizer and vaporizing the non-halogenated liquid organometallic metal precursor;
  allowing a first mixture of the carrier gas and the vaporized non-halogenated liquid organometallic metal precursor to leave the vaporizer;
  optionally mixing the first mixture with a gaseous carbon source, a gaseous nitrogen source, a gaseous oxygen source, or a mixture thereof to produce a second mixture; and
  either:
    causing the first mixture to flow into the chemical vapor infiltration reactor and through the porous mass at operating temperature $T_1$, allowing deposition of a desired metal matrix within void spaces within the porous mass; or
    causing the second mixture to flow into the chemical vapor infiltration reactor and through the porous mass at operating temperature $T_1$, allowing deposition of a desired ceramic matrix within void spaces within the porous mass.

In the method of chemical vapor infiltration, the non-halogenated liquid organometallic metal precursor may be a compound of a metal selected from the group consisting of Zr, Hf, Nb, Ta, W, V, Ti, and a mixture thereof. The metal in the non-halogenated liquid organometallic metal precursor may be bound to an alkoxide group, an amino group, an imino group, or a combination thereof. The non-halogenated liquid organometallic metal precursor may have a formula $M^{+n}L_n$, $M^{+n}L^1_{(n-m)}L^2_{(m)}$, or $(L_3=)_pM^{+n}L_{(n-2p)}$, wherein:
  M is Zr, Hf, Nb, Ta, W, V, Ti, or a mixture thereof;
  L and $L^1$ are independently selected from C1-C4 alkyl groups, C1-C4 alkoxy groups, bis(C1-C4 dialkyl) amido groups, or a combination thereof;
  $L^2$ is a cyclopentadienyl anion;
  $L^3$ is O= or RN=, wherein R is alkyl;
  m is 1 or 2,
  p is 1 or 2, and
  n is the valency of the metal M.

Various embodiments disclosed herein relate to a method of coating a metal or ceramic layer on a solid material by chemical vapor deposition, including the steps:
  introducing the solid material into a chemical vapor deposition reactor;
  heating the chemical vapor deposition reactor to a desired operating temperature $T_1$.
  initiating a flow of a carrier gas through a vaporizer;
  injecting a non-halogenated liquid organometallic metal precursor into the vaporizer and vaporizing the non-halogenated liquid organometallic metal precursor;

allowing a first mixture of the carrier gas and the vaporized non-halogenated liquid organometallic metal precursor to leave the vaporizer;

optionally mixing the first mixture with a gaseous carbon source, a gaseous nitrogen source, a gaseous oxygen source, or a mixture thereof to produce a second mixture; and either:

causing the first mixture to flow into the chemical vapor deposition reactor at operating temperature $T_1$, allowing deposition of a desired metal coating on the solid material; or causing the second mixture to flow into the chemical vapor deposition reactor at operating temperature $T_1$, allowing deposition of a desired ceramic coating on the solid material.

In the method of coating a metal or ceramic layer on a solid material by chemical vapor deposition, the non-halogenated liquid organometallic metal precursor may be a compound of a metal selected from the group consisting of Zr, Hf, Nb, Ta, W, V, Ti, and a mixture thereof. The metal in the non-halogenated liquid organometallic metal precursor may be bound to an alkoxide group, an amino group, an imino group, or a combination thereof.

BRIEF DESCRIPTION OF THE DRAWINGS

In order to better understand various exemplary embodiments, reference is made to the accompanying drawings, wherein.

DETAILED DESCRIPTION

Figure 1:
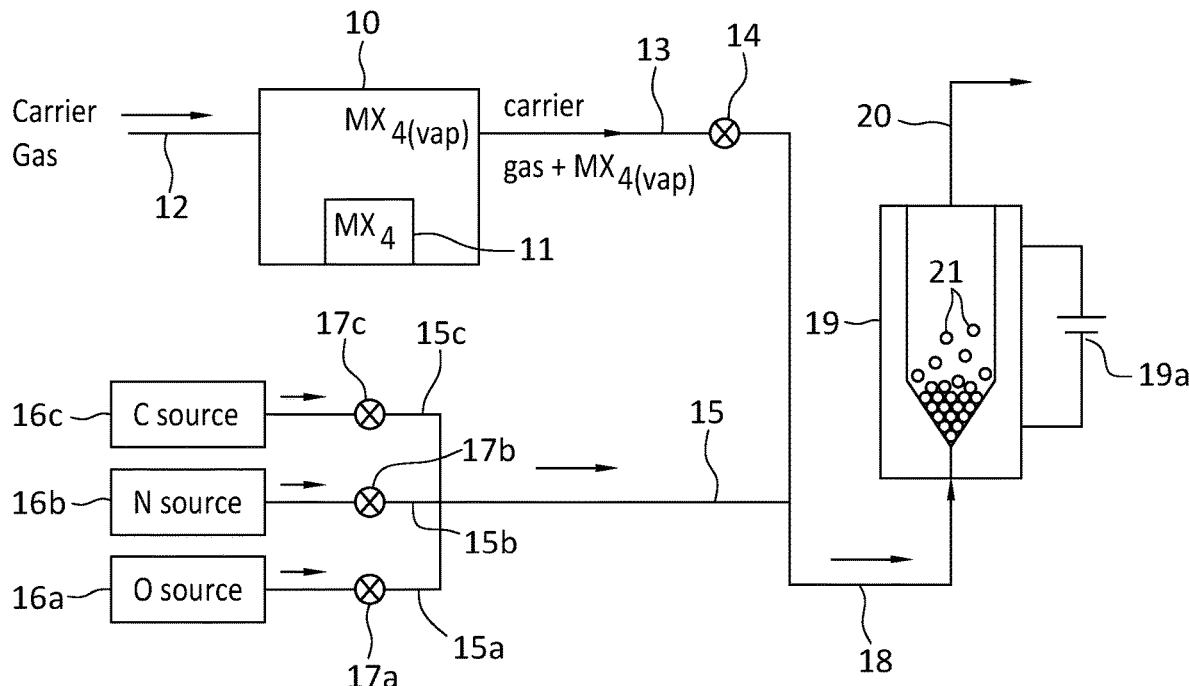
FIG. 1 illustrates a prior art system for fluidized bed CVD using a solid metal halide as a metal precursor for deposition of a ceramic layer.

Referring now to the drawings, in which like numerals refer to like components or steps, there are disclosed broad aspects of various exemplary embodiments.

As used herein, a TRISO particle contains a uranium-based ceramic nuclear fuel kernel as a core, coated sequentially by:

an inner porous carbon layer;

an inner dense pyrolytic carbon layer;

a ceramic layer, e.g., a carbide, nitride, oxide, or oxycarbide, of a metal; and an outer dense pyrolytic carbon layer.

As used herein, a TRISO-like particle contains a ceramic nuclear fuel kernel, e.g., an oxide, carbide, nitride, or oxycarbide of uranium, plutonium, thorium, or a mixture thereof, as a core; coated with at least one carbon layer and at least one ceramic layer, e.g., a carbide, nitride, oxide, or oxycarbide, of a metal. The carbon and ceramic layers may be deposited in any order.

Oxides, carbides, nitrides, and borides of metals such as zirconium, hafnium, vanadium, niobium, tantalum, and titanium are highly valued due to their chemical and mechanical properties. These properties include high melting point, density, and hardness. This makes thin layers of ceramics of zirconium, hafnium, niobium, tantalum, or mixtures thereof highly valued in nuclear applications for both terrestrial and space applications. However, chlorides and other halides of these metals are high-melting solids, as seen in Table 1. While these compounds can be vaporized by sublimation, in many cases, this occurs at a temperature exceeding 300° C., as shown in Table 1.

Chemical vapor deposition (CVD) and chemical vapor infiltration (CVI) of oxides, carbides, borides, and nitrides of transition metals has historically been difficult, due to utilizing halide-based metal precursors, such as the metal halide salts of Table 1. Utilizing these halide-based precursors is difficult for two reasons:

the halide presence, which presents a toxicity and corrosion concern, and the non-ideal chemical properties of the halides.

TABLE 1

Thermal properties of metal halide CVD source compounds.

| CVD Source Compound | Melting Point | Sublimation Point |
|---|---|---|
| $ZrCl_4$ | 437° C. | 331° C. |
| $ZrBr_4$ | 450° C. | 355° C. |
| $ZrI_4$ | 499° C. | 431° C. |
| $HfCl_4$ | 432° C. | 320° C. |
| $NbCl_5$ | 204.7° C. | Sublimes |
| $TaCl_5$ | 216.7° C. | Sublimes |
| $WCl_6$ | 283° C. | |

The halides in Table 1 are not ideal for CVD/CVI because they exist as a solid at standard temperature and pressure (STP), and/or have a low vapor pressure low vapor pressure at STP. Due to these non-ideal chemical properties, delivery of the precursors of Table 1 has necessitated complex delivery systems such as pneumatic transfer systems, metal chlorination systems, or salt sublimation furnaces. This has made the CVD and CVI production of metal carbides very difficult and non-feasible beyond lab-scale operations.

Some metal halide precursors, such as vanadium(IV) chloride and titanium(IV) chloride, are liquids at STP. While this would make them seem to be useful CVD/CVI metal deposition source materials, they are not free of problems. They contain halides and may produce halogen gas and/or hydrogen halide gas at deposition temperature. For example, when vanadium(IV) chloride is heated, it may produce toxic fumes of vanadium oxide and chorine-containing gases.

FIG. 1 shows a prior art system for deposition of a ceramic layer using a solid metal halide, $MX_4$, as a metal source 11. A carrier gas enters a sublimation furnace 10 through gas input 12. The carrier gas carries vaporized metal halide, $MX_{4(vap)}$, from sublimation furnace 10 through output 13. A valve or other mass flow controller 14 controls the rate at which the carrier gas passes through output 13. The valve 14 may adjust the flow of the carrier gas in response to a signal from a sensor (not shown) which measures the concentration of $MX_{4(vap)}$ in the carrier gas. If the metal concentration in the carrier gas is lower than desired, the valve 14 may be used to increase carrier gas flow rate. If the metal concentration in the carrier gas is higher than desired, the valve 14 may be used to reduce carrier gas flow rate.

The system of FIG. 1 includes at least one of a gaseous oxygen source 16a, a gaseous nitrogen source 16b, and a gaseous carbon source 16c. These oxygen, nitrogen, and carbon sources frow through gas inputs 15a, 15b, and 15c, respectively. Valves 17a, 17b, and 17c may be used to control the flow rates of the oxygen, nitrogen, and carbon sources, respectively. If a carbide ceramic is desired, valve 17c may be opened and valves 17a and 17b may be closed, for example. If a nitride ceramic is desired, valve 17b may be opened and valves 17a and 17c may be closed. If a carbonitride ceramic is desired, valves 17b and 17c may be opened and valve 17a may be closed. The oxygen, nitrogen, and carbon sources flow through a gas flow passage 15, which meets output 13 from sublimation furnace 10. The carrier gas in output 13 then enters passage 18 and flows to a fluidized bed reactor 19, carrying vaporized metal halide, $MX_{4(vap)}$, and the oxygen, nitrogen, and/or carbon source gases from gas flow passage 15. In fluidized bed reactor 19, the vaporized metal halide, $MX_{4(vap)}$, and the oxygen, nitrogen, and/or carbon source gases react to produce a ceramic coating on particles 21, and the carrier gas exits the reactor through passage 20. The fluidized bed reactor 19 is heated with a heat source 19a, which may be a resistive heat source 19a configured to cause electrical energy to flow through reactor 19.

Figure 2A:
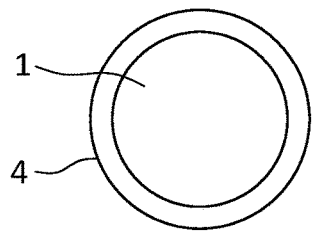
FIGS. 2A and 2B illustrate particles with ceramic layers deposited by the system of FIG. 1.

FIG. 2a shows a core particle 1 with a ceramic coating 4 produced by the system of FIG. 1. The particle 1 may be a solid metal or ceramic, which does not melt at the deposition temperature in the fluidized bed reactor 19 of FIG. 1. In various embodiments, core particle 1 is a nuclear fuel kernel. As used herein, "fuel kernel 1" is a core particle 1 made of a radioactive ceramic material.

Figure 2B:
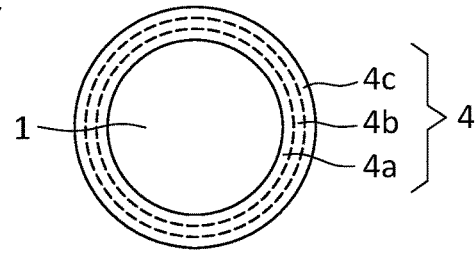

FIG. 2b shows a particle 1 with a ceramic coating 4 produced by the system of FIG. 1, where the coating 4 may have a variable structure. The particle 1 may be a solid metal or ceramic. The coating 4 may have an inner layer 4a, a middle layer 4b, and an outer layer 4c, and may be created by adjusting the flow rates of the deposition gases during deposition in the fluidized bed reactor 19. For example, in one embodiment, layers 4a to 4c are metal carbide layers $M_nC_{(2-n)}$, where the ratio of metal to carbon changes. During deposition of layer 4a, a high concentration of a carbon source gas may be used relative to vaporized metal halide $MX_{4(vap)}$, so n<1, <0.8, or ≤0.5 and the metal carbide layer 4a is rich in carbon. During deposition of layer 4b, a concentration of a carbon source gas may be reduced relative to vaporized metal halide $MX_{4(vap)}$, so n=1 and the metal carbide layer 4b is MC. During deposition of layer 4b, a concentration of a carbon source gas may be further reduced relative to vaporized metal halide $MX_{4(vap)}$, so n>1 and the metal carbide layer 4c is carbon poor.

Figure 3:
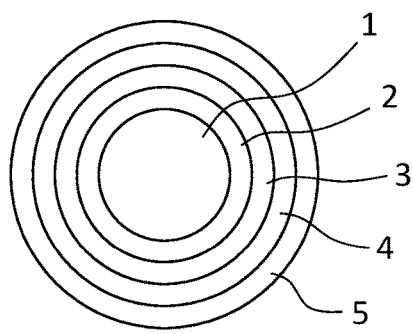
FIG. 3 illustrates a nuclear fuel particle with a ceramic layer deposited by the system of FIG. 1.

The system of FIG. 1 may be used to produce a tristructural-isotropic (TRISO) nuclear fuel particle, shown in FIG. 3. The TRISO particle contains a core particle 1, where particle 1 is a fuel kernel composed of a uranium ceramic material, e.g., uranium oxides ($UO_2$ or $U_3O_8$, for example), uranium carbide (UC), uranium nitrides, ($UN_2$ or $U_2N_3$, for example), or uranium oxycarbide (UCO) in the center, coated with three isotropic materials deposited through chemical vapor deposition in a fluidized bed reactor 19. The fuel kernel 1 is coated with a porous buffer layer 2 made of carbon, followed by a dense inner layer 3 of pyrolytic carbon (PyC), followed by a ceramic layer 4 to increase structural integrity of the TRISO particle, followed by a dense outer layer 5 of PyC.

In various embodiments, the system of FIG. 1 may be used to produce a TRISO-like nuclear fuel particle, similar to that shown in FIG. 3. The TRISO-like particle contains a fuel kernel 1 composed of a radioactive ceramic material, e.g., an oxide, carbide, oxycarbide, or nitride of plutonium or thorium, in the center. The fuel kernel is coated with isotropic materials deposited through chemical vapor deposition in a fluidized bed reactor 19. The fuel kernel 1 may be coated with at least one of:

a porous buffer layer 2 made of carbon deposited on the fuel kernel, a dense inner layer 3 of pyrolytic carbon (PyC) deposited on the fuel kernel; and a ceramic layer 4.

The fuel kernel 1 may be coated with both a porous carbon buffer layer and an inner layer of pyrolytic carbon, sequentially deposited on fuel kernel 1. The carbon-coated fuel kernel may then be coated with a ceramic layer 4 to increase structural integrity of the TRISO-like particle, optionally followed by a dense outer layer 5 of PyC. In various embodiments, the fuel kernel 1 may be coated with a ceramic layer, without depositing an intervening carbon layer on fuel kernel 1.

In various embodiments, the system of FIG. 1 may be used to produce a TRISO-like nuclear fuel particle containing a fuel kernel 1 composed of a radioactive ceramic material, e.g., an oxide, carbide, oxycarbide, or nitride of uranium, plutonium, or thorium, in the center. The fuel kernel may then be directly coated with a ceramic layer 4, without an intervening carbon layer. The ceramic-coated fuel kernel may then optionally be coated with an outer layer 5 of PyC.

Figure 4:
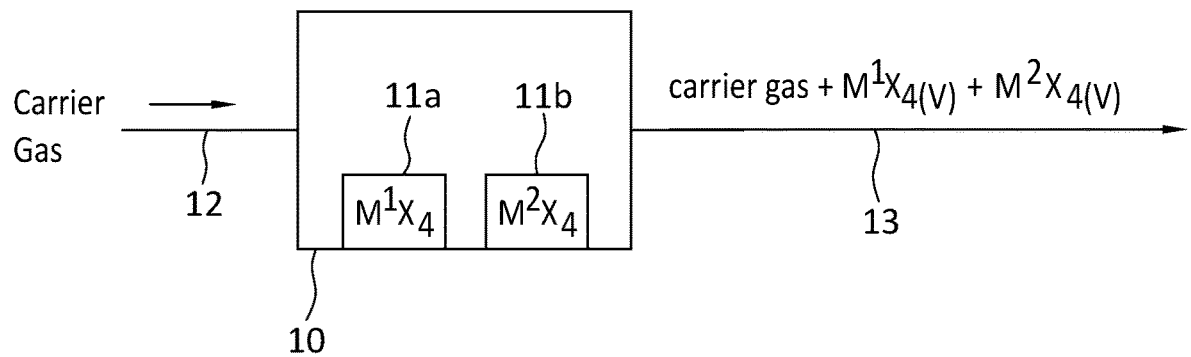
FIGS. 4 and 5 illustrate modifications of the system of FIG. 1 allowing deposition of a ceramic layer containing a mixture of metals.

One issue with working with solid metal halides as metal sources in the system of FIG. 1 is that it limits options for preparation of ceramic layers containing mixed metals by CVD. For example, FIG. 4 shows modification of the system of FIG. 1 to show use of a first solid metal halide 11a, $M^1X_4$, and a second solid metal halide 11a, $M^2X_4$, in sublimation furnace 10. The carrier gas carries exiting through output 13 carries both vaporized metal halides, $M^1X_{4(vap)}$ and $M^2X_{4(vap)}$, from sublimation furnace 10. However, in the sublimation furnace, both halides 11a and 11b must be solid at the sublimation temperature, and both must have reasonable vapor pressures at the desired sublimation temperature.

Referring to Table 1, $ZrCl_4$ and $HfCl_4$ have similar melting points and sublimation temperatures and can be co-deposited by CVD from a sublimation furnace 10, as shown in FIG. 4. However, within the sublimation furnace 10, vaporized metal halides $M^1X_{4(vap)}$ and $M^2X_{4(vap)}$ exist in an equilibrium state, leading to deposition of a mixed metal ceramic containing a fixed ratio of $M^1$ to $M^2$, making it difficult to control the final product. Further, it may be desirable to co-deposit a first metal from a metal halide with a high sublimation point, e.g., $ZrCl_4$, and a second metal from a metal halide with a low sublimation point, e.g., $TaCl_5$. This cannot be conveniently done with a single sublimation furnace 10, as shown in FIG. 4.

Figure 5:
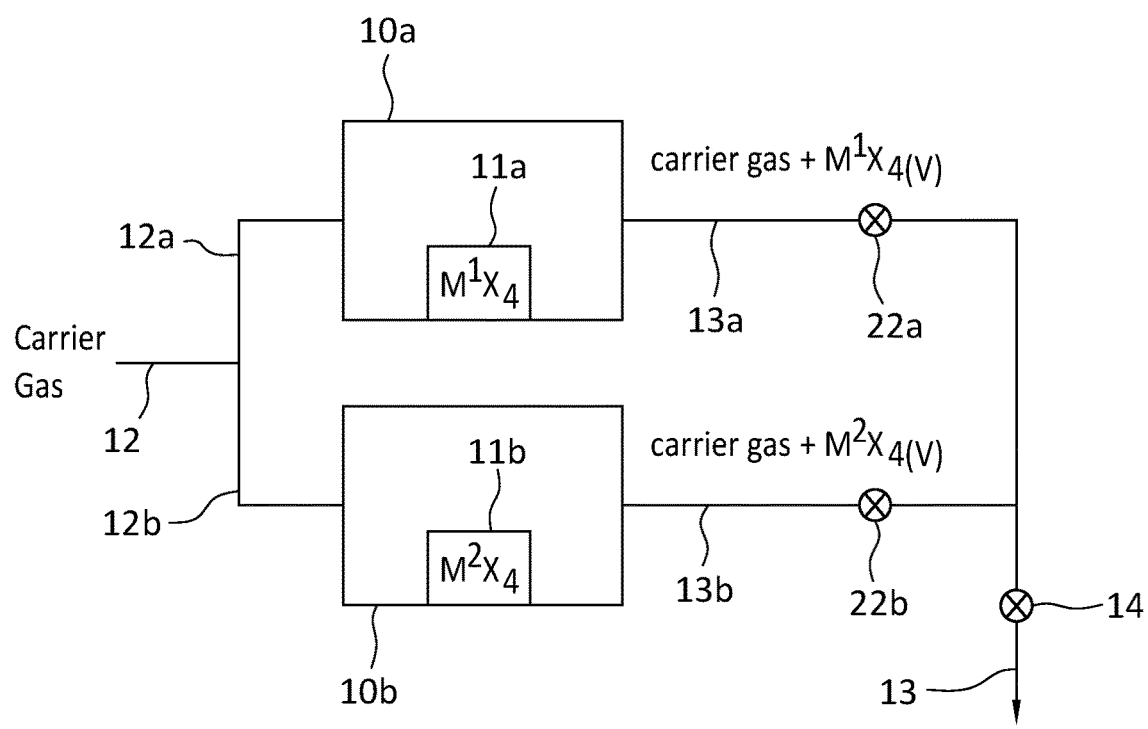

These problems may be addressed using multiple sublimation ovens, as shown in FIG. 5. Oven 10a receives a carrier gas through gas input 12a, and contains a first metal deposition precursor 11a with formula $M^1X_4$ with a first sublimation temperature. The carrier gas carries vaporized metal halide, $M^1X_{4(vap)}$, from sublimation furnace 10a through output 13a. Oven 10b receives the carrier gas through gas input 12b, and contains a second metal deposition precursor 11b with formula $M^2X_4$ with a second sublimation temperature. The carrier gas carries vaporized metal halide $M^2X_{4(vap)}$, from sublimation furnace 10b through output 13b. Outputs 13a and 13b each have a valve (14a and 14b, respectively) controlling a gas flow rate from their respective sublimation ovens 10a and 10b. Outputs 13a and 13b may combine to form a common gas flow line 13, leading to a fluidized bed reactor, generally as shown in FIG. 1.

The system of FIG. 5 allows co-deposition of a first metal from a first metal halide sublimation source 11a with a high sublimation point, e.g., $ZrCl_4$, and a second metal from a second metal halide sublimation source 11b with a low sublimation point, e.g., $TaCl_5$. This may be done by heating oven 10a to a temperature where the metal halide sublimation source 11a sublimes, e.g., 331° C. for $ZrCl_4$, and heating oven 10b to a temperature where the metal halide sublimation source 11b sublimes, e.g., ~200° C. for $TaCl_4$. Also, the system of FIG. 5 allows co-deposition of a first metal from a first metal halide sublimation source 11a and a second metal from a second metal halide sublimation source 11b, where 11a and 11b have similar sublimation points, e.g., $ZrCl_4$ and $HfCl_4$. This may be done by heating oven 10a and oven 10b to a sublimation temperature. The ratio of $M^1$ to $M^2$ in the final deposition product may be controlled by adjusting the relative flow rates of the metal-bearing carrier gas from oven 10a and of the metal-bearing carrier gas from oven 10b with valves 22a and 22b. However, while the system of FIG. 5 works, the use of two separate sublimation ovens adds complexity to the system. Additionally, it does not avoid formation of toxic halogen and hydrogen halide gases.

Figure 6:
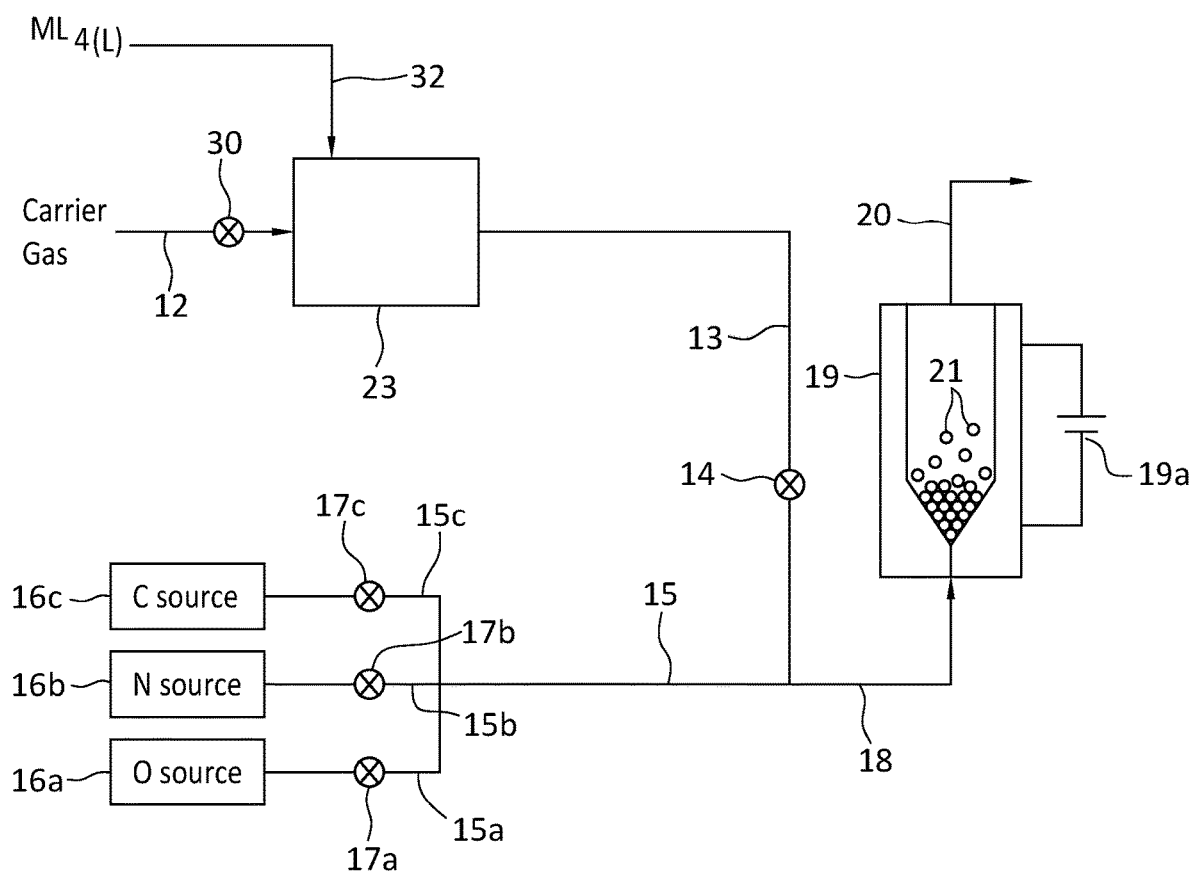
FIG. 6 illustrates a system for fluidized bed CVD using a liquid organometallic compound as a metal precursor for deposition of a ceramic layer.

FIG. 6 shows a system for deposition of a ceramic layer using a liquid non-halogenated metal compound, $ML_{4(l)}$, as a metal source. Use of a liquid non-halogenated metal compound avoids the need for a sublimation oven, and prevents formation of toxic halogen-containing by products during CVD/CVI. In the system of FIG. 6, a carrier gas enters a vaporizer 23 through gas input 12, with the flow rate of the carrier gas being controlled by valve 30. A liquid non-halogenated metal compound is injected into the vaporizer 23 through input 32. The metal compound is vaporized, and the carrier gas carries the vaporized metal compound, $MLA_{4(vap)}$, from vaporizer 23 through output 13. A valve or other mass flow controller 14 controls the rate at which the carrier gas passes through output 13. The system of FIG. 6 includes at least one of a gaseous oxygen source 16a, a gaseous nitrogen source 16b, and a gaseous carbon source 16c. These oxygen, nitrogen, and carbon sources frow through gas inputs 15a, 15b, and 15c, respectively, in a manner similar to that shown in FIG. 1. The oxygen, nitrogen, and carbon sources flow through valves 17a, 16b, and 17c, respectively, and into a gas flow passage 15, which meets output 13 from vaporizer 23. The carrier gas in output 13 then enters passage 18 and flows to a fluidized bed reactor 19, carrying the vaporized metal compound and the oxygen, nitrogen, and/or carbon source gases from gas flow passage 15. The flow rate of the carrier gas from output 13 to reactor 19 through passage 18 may be controlled with valve 14. The control valves used in the system of FIG. 6 may be needle valves, which can restrict the flow of fluid or gas flow by incremental amounts, allowing the needle valves to adjust the flow rate of a carrier gas, a carrier gas carrying vaporized metal precursor, and a carbon, nitrogen, and/or oxygen source flow to reactor 19. The valves used in the system of FIG. 6 may be ball valves; however, ball valves do not allow incremental adjustment of flow rates, and are therefore less preferred. Other types of valves which may be used include diaphragm valves, globe valves, pinch valves, bellow seals, and butterfly or throttle valves. Weir-type diaphragm valves in particular may be used to control flow rate through the valves by incrementally restricting the flow of fluid or gas flow.

The fluidized bed reactor 19 is maintained at a desired temperature T1 suitable for deposition of a coating layer on particles 21, and at a pressure suitable for deposition. The fluidized bed reactor 19 is heated with a heat source 19a, which may be a resistive heat source 19a configured to cause electrical energy to flow through reactor 19. The deposition pressure may be elevated, e.g., greater than atmospheric pressure; atmospheric pressure; or a partial vacuum, e.g., less than atmospheric pressure. In fluidized bed reactor 19, the vaporized metal compound and the oxygen, nitrogen, and/or carbon source gases react to produce a ceramic coating on particles 21, and the carrier gas exits the reactor through passage 20. Since the metal compound precursor injected into the vaporizer is not halogenated, a ceramic coating is deposited on particles 21 without production of halogen or hydrogen halide gases. In various embodiments, chemical vapor deposition of a ceramic layer using an organometallic metal compound as a metal precursor may be carried out in a fluidized bed reactor at atmospheric pressure or under a partial vacuum. Deposition in reactor may be carried out at a pressure of 1 to 760 torr, 1 to 20 torr, 10 to 200 torr, 20 to 400 torr, 20 to 300 torr, 400 to 760 torr, 400 to 550 torr, 300 to 600 torr, or 200 to 500 torr.

In the system of FIG. 6, temperature measurement in vaporizer 23 and chemical deposition reactor 19 is performed with a combination of thermocouples and pyrometers (not shown), which can measure the temperatures of the vaporizer, the shell of reactor 19, and the particles 21. Temperatures can be accurately measured at a temperature as low as 10° C., or as high as 3000° C.

The non-halogenated liquid organometallic metal precursor may be a compound of a metal selected from the group consisting of Zr, Hf, Nb, Ta, W, V, Ti, and a mixture thereof. The metal in the non-halogenated liquid organometallic metal precursor may be bound to an alkoxide group, an amino group, an imino group, or a combination thereof.

The method disclosed herein is directed to deposition of nitrides, carbides, and oxides of metals using non-halogenated liquid metal compounds of formula $M^{+n}L_n$, $M^{+n}L^1_{(n-m)}L^2_{(m)}$, and $(L^3=)_p M^{+n}L_{(n-2p)}$. In these formulas, M is Zr, Hf, Nb, Ta, W, V, Ti, or a mixture thereof;

L and $L^1$ are independently selected from C1-C4 alkyl groups, C1-C4 alkoxy groups, or bis(C1-C4 dialkyl) amido groups;

$L^2$ is a cyclopentadienyl anion;

$L^3$ is a bivalent radical, e.g., O= or RN=, where R is alkyl;

m is 1 or 2, p is 1 or 2; and the valency of the metal M is n.

The discussion herein may refer to a compound $ML_4$ as an example of a liquid organometallic compound for use as a metal precursor. This should not be understood to exclude compounds of trivalent, pentavalent, or hexavalent metals.

Liquid metal compounds useful as metal deposition sources for CVD include:

metal alkoxides, e.g., metal C1-$C_4$ alkoxides such as titanium(IV) isopropoxide, titanium(IV) isobutoxide, hafnium(IV) butoxide, niobium(V) t-butoxide, niobium(III) t-butoxide, and zirconium(IV) butoxide; and metal amines, such as:

(tert-butylimino)tris(diethylamino)tantalum(V) ($^t$BuN=Ta(NEt$_2$)$_3$, TBTDET);

(tert-butylimino)tris(diethylamino)niobium(V) ($^t$BuN=Nb(NEt$_2$)$_3$, TBTDEN);

(tert-butylimino)tris(methylethylamino)niobium(V) ($^t$BuN=Nb(NMeEt)$_3$);

tris(diethylamino)niobium(III) (Nb(NEt$_2$)$_3$);

tris(methylethylamino)niobium(III) (Nb(NMeEt)$_3$);

tris(diethylamino)niobium(III) (Nb(NEt$_2$)$_3$);

tris(dimethylamino)cyclopentadienyl zirconium(IV) (CpZr(NMe$_2$)$_3$, ZyALD);

tetrakis(isopropylmethylamino)zirconium(IV) (Zr(NiPrMe)$_4$, TMPAZ);

tetrakis(ethylmethylamino)zirconium(IV) (Zr(NEtMe)$_4$, TEMAZ);

tetrakis(diethylamino)zirconium(IV) (Zr(NiPrMe)$_4$, TDEAZ);

tris(dimethylamino)cyclopentadienyl hafnium(IV) (CpZr(NMe$_2$)$_3$);

bis(methylimino)bis(dimethylamino)tungsten(VI) ((MeN=)$_2$W(NMe$_2$)$_2$); and bis(tert-butylimino)bis(dimethylamino)tungsten(VI) (($^t$BuN=)$_2$W(NMe$_2$)$_2$).

Suitable carrier gases include argon, hydrogen, helium, nitrogen, carbon dioxide, and other carrier gases known in the art. The metal deposition source may be combined with the gaseous carbon source to produce a metal carbide ceramic coating. Suitable carbon sources for use in CVD include gaseous hydrocarbons, e.g., methane, ethane, ethylene, propylene, acetylene, and natural gas. Alternatively, the metal deposition source may be combined with the gaseous oxygen source to produce a metal oxide ceramic coating. Suitable oxygen sources for use in CVD include ozone, oxygen, nitric oxide, and nitrous oxide. The metal deposition source may be combined with the gaseous nitrogen source to produce a metal nitride ceramic coating. Suitable nitrogen sources for use in CVD include nitrogen gas and ammonia. Also, if desired, the carrier gas containing the vaporized metal deposition source may flow from vaporizer 23 to fluidized bed reactor 19 without introducing a carbon, oxygen, or nitrogen source, allowing deposition of a metal coating layer instead of a ceramic coating layer. Using the system of FIG. 6, a pure metal layer may be deposited by closing valves 17a, 17b, and 17c during CVD/CVI, and optionally removing sources 16a, 16b, and 16c from the system.

Figure 7:
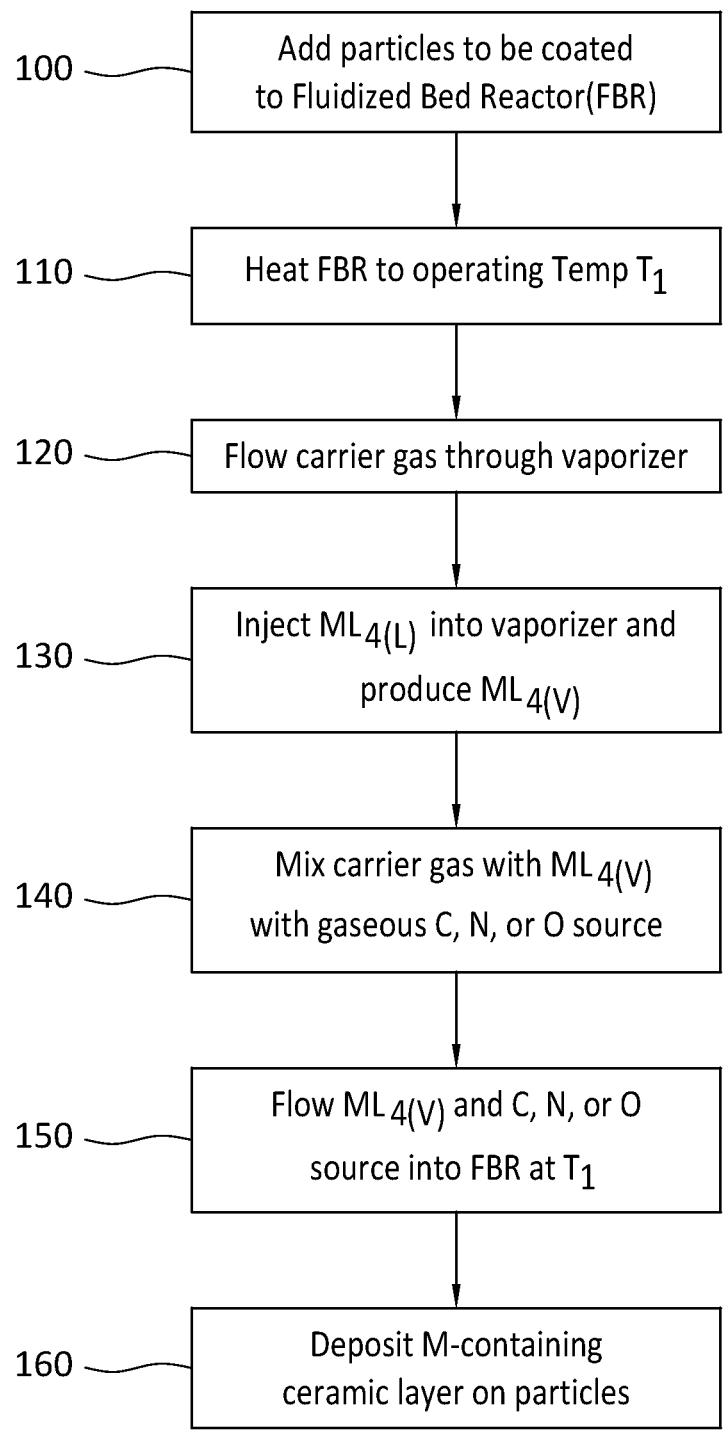
FIG. 7 illustrates a flow chart showing a method for fluidized bed CVD using a liquid organometallic compound as a metal precursor for deposition of a ceramic layer.

FIG. 7 shows a flow chart for deposition of a ceramic on particles 21 using the system of FIG. 6. In step 100, particles 21 are added to fluidized bed reactor 19 for coating. In step 110, the fluidized bed reactor 19 is heated to the desired operating temperature $T_1$. In step 120, the flow of a carrier gas through vaporizer 23 is initiated. In step 130, a liquid metal precursor, $ML_{4(L)}$, is injected into vaporizer 23. In step 140, the carrier gas leaves vaporizer 23 through outlet 13 carrying a vaporized metal precursor, $ML_{4(v)}$, and is mixed with a gaseous carbon, nitrogen, or oxygen source. In step 150, the mixed gas flows into the fluidized bed reactor 19 at operating temperature $T_1$, allowing deposition of the desired ceramic coating on particles 21 in step 160.

Figure 8:
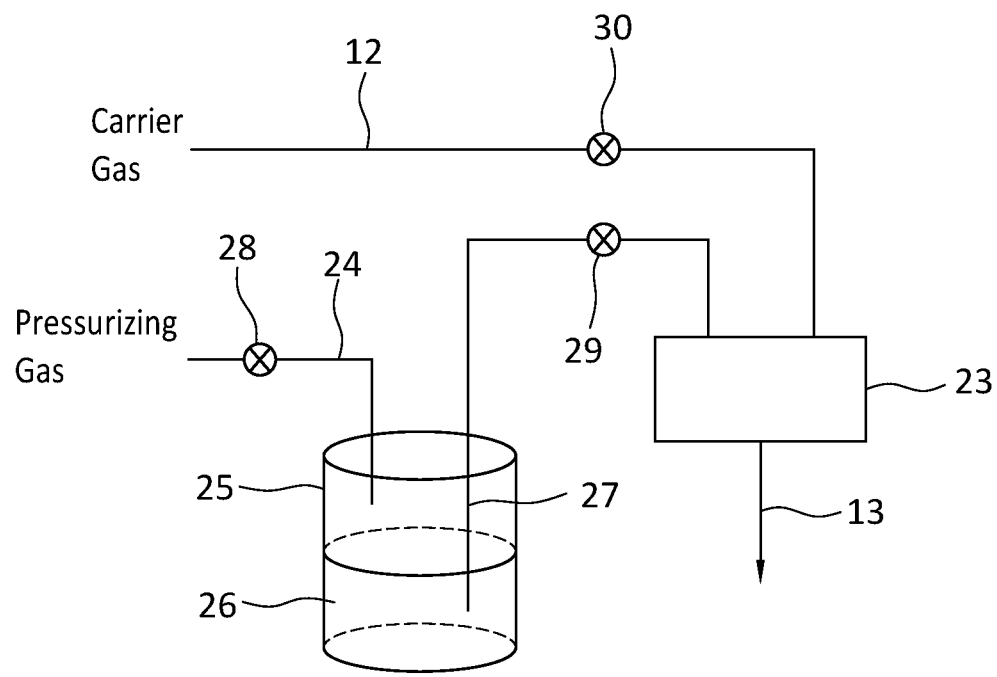
FIGS. 8 and 9 illustrate systems for vaporizing a liquid organometallic compound to produce a gaseous metal precursor for deposition of a ceramic layer.

FIG. 8 shows a first embodiment of an apparatus for vaporizing a liquid organometallic compound for use as a metal deposition precursor. A liquid precursor compound 26 is delivered with a defined liquid flow into a vaporization unit 23. A liquid supply cylinder 25 is pressurized with an inert gas, e.g., argon, helium, hydrogen, or nitrogen supplied through input 24. To control the pressure in cylinder 25, the flow of the pressurizing gas is controlled with a regulator or a mass flow controller, e.g., valve 28. The pressure in the cylinder 25 provides motive force to force the liquid precursor compound 26 to flow into a dip tube 27. Dip tube 27 carries the liquid precursor compound 26 to vaporizer 23. The rate at which liquid precursor compound 26 enters vaporizer 23 may be controlled by a liquid mass flow controller, e.g., valve 29, controlling flow through dip tube 27. As liquid precursor compound 26 flows into vaporizer 23, a carrier gas flows into vaporizer 23 through input 12. The pressure of the carrier gas in the vaporizer may be controlled by adjusting carrier gas flow rate with valve 30. In vaporizer 23, liquid precursor compound 26 subjected to conditions of temperature and pressure which vaporize compound 26, mixing vaporized compound 26 with the carrier gas. The vaporized precursor compound 26 is carried by a stream of the carrier gas into output 13, which leads to a fluidized bed reactor 19, as shown in FIG. 6.

If liquid precursor compound 26 is low boiling, vaporizer 23 may be maintained at atmospheric pressure and heated to a temperature above the normal boiling point, i.e., the boiling point at a pressure of 1 atm. of the liquid precursor compound 26 to vaporize compound 26. Alternatively, for a low boiling precursor compound 26, vaporizer 23 may be maintained at ambient temperature, e.g., 25° C.±5° C., and the pressure in vaporizer 23 may be reduced until the liquid precursor compound 26 boils. If liquid precursor compound 26 is high boiling, vaporizer 23 may be maintained under a reduced pressure to reduce the boiling point of compound 26, and heated until compound 26 vaporizes. For a high boiling compound 26, boiling under reduced pressure reduces the likelihood of thermal degradation of compound 26 in vaporizer 23.

In various embodiments, liquid precursor compound 26 is a liquid organometallic compound of zirconium, hafnium, niobium, tantalum, tungsten, vanadium, or titanium. If liquid precursor compound 26 is a liquid organometallic compound, a ceramic layer containing a metal may be deposited in fluidized bed reactor 19. For example, if the liquid precursor compound 26 is ZyALD, a layer of a zirconium ceramic, e.g., ZrC, $Zr_3N_4$, or $ZrO_2$, may be deposited in fluidized bed reactor 19.

Various embodiments disclosed herein include a bubble cylinder for saturating a stream of a carrier gas with a vapor from a liquid precursor compound 26. A carrier gas flows through input 12 into liquid supply cylinder 25. The flow rate of the carrier gas into liquid supply cylinder 25 may be controlled using a mass flow controller, e.g., valve 30. The carrier gas from input 12 flows into bubbler 12, which is submerged below the surface of a liquid precursor compound 26 in liquid supply cylinder 25. As carrier gas flows out of bubbler 31 and through the liquid precursor compound 26 in the liquid supply cylinder 25, the liquid precursor compound 26 is entrained into the carrier gas as a vapor. Carrier gas containing vaporized precursor compound 26 exits the liquid supply cylinder 25 through output 13, which leads to a fluidized bed reactor 19, as shown in FIG. 6.

Figure 9:
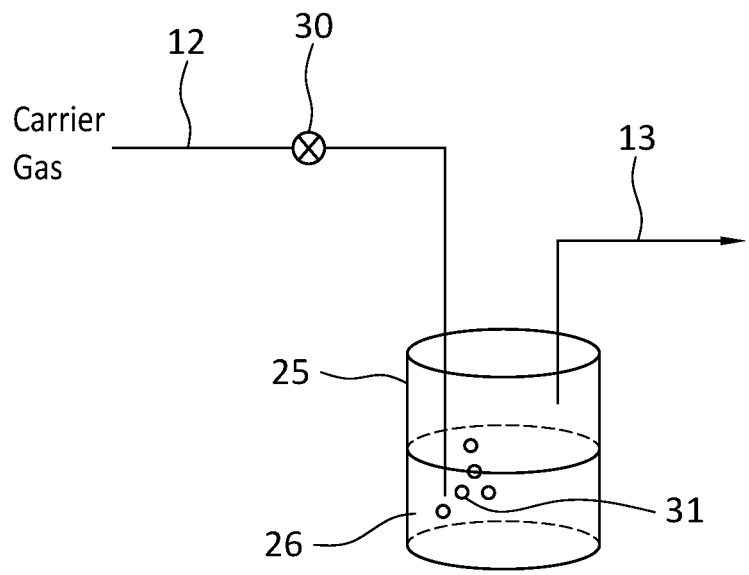

If the liquid precursor compound 26 has a high vapor pressure and/or a low boiling point, vapor from liquid precursor compound 26 may be entrained into the carrier gas using the system of FIG. 9 without heating the liquid precursor compound 26 in liquid supply cylinder 25. However, if the liquid precursor compound 26 has a low vapor pressure and/or a high boiling point, it will be necessary to heat liquid supply cylinder 25 to successfully entrain vapor from liquid precursor compound 26 into the carrier gas using the system of FIG. 9.

In various embodiments, the liquid precursor compound 26 used in the system of FIG. 9 is a liquid organometallic compound of zirconium, hafnium, niobium, tantalum, tungsten, vanadium, or titanium.

This technology disclosed herein can be used to produce ceramic alloys by co-depositing liquid organometallic precursors with each other and/or with additional gasses. This allows production of unique alloyed metal ceramics for terrestrial and space nuclear applications.

Figure 10A:
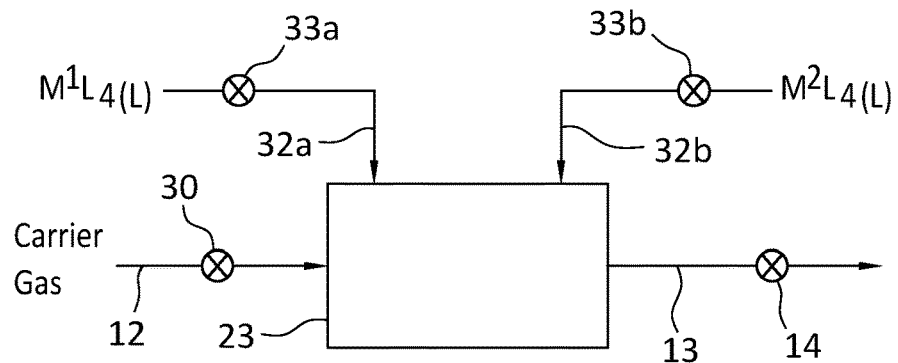
FIG. 10a illustrates a first modification of the vaporizer in the system of FIG. 6, allowing deposition of a ceramic layer containing a mixture of metals.

FIG. 10a shows a first modified version of a vaporizer for use in the system of FIG. 6. In the system of FIG. 10a, a carrier gas enters a vaporizer 23 through gas input 12, with the flow rate of the carrier gas being controlled by valve 30. A first liquid non-halogenated metal compound, $M^1L_{4(L)}$, is injected into the vaporizer 23 through input 32a. A second liquid non-halogenated metal compound, $M^2L_{4(L)}$, is injected into the vaporizer 23 through input 32b. The flow rates of the first and second liquid non-halogenated metal compounds are controlled by valves 33a and 33b, respectively. The source of each liquid non-halogenated metal compound may be a system according to FIG. 8 or FIG. 9, as desired.

In vaporizer 23, the metal compounds $M^1L_4$ and $M^2L_4$ are vaporized, and the carrier gas carries the vaporized metal compounds from vaporizer 23 through output 13. A valve or other mass flow controller 14 controls the rate at which the carrier gas passes through output 13. The carrier gas in output 13 then flows to a fluidized bed reactor 19, carrying the vaporized metal compounds, as shown in FIG. 6. In various embodiments, valves 33a and 33b may be adjusted so that $M^1L_4$ and $M^2L_4$ flow into vaporizer 23 at a fixed mass ratio, allowing deposition of a ceramic alloy of constant composition in reactor 19.

Alternatively, valves 33a and 33b may be adjusted so that $M^1L_4$ and $M^2L_4$ flow into vaporizer 23 at a variable ratio, allowing deposition of a ceramic alloy having a variable composition in reactor 19. For example, if valves 33a and 33b are initially set so that $M^1L_4$ and $M^2L_4$ flow into vaporizer 23 at a 2:1 mole ratio, a ceramic alloy layer rich in $M^1$ is initially deposited. If deposition is continued while subsequently adjusting valves 33a and 33b so that $M^1L_4$ and $M^2L_4$ flow into vaporizer 23 at a 1:2 mole ratio, a second ceramic alloy layer rich in $M^2$ is subsequently deposited. If valves 33a and 33b are returned to their original positions, a third ceramic alloy layer rich in $M^1$ is deposited, resulting in a multi-layered ceramic coating. This may be done in fluidized bed reactor 19, without terminating the deposition process, resulting in multiple alternating layers, where two layers of a first ceramic material are separated by a layer of a second ceramic material.

Alternatively, in a single deposition procedure, valves 33a and 33b may be:
  initially set so that $M^1L_4$ and $M^2L_4$ flow into vaporizer 23 at a 2:1 mole ratio, so that a first ceramic alloy layer rich in $M^1$ is initially deposited in reactor 19, then
  adjusted so that $M^1L_4$ and $M^2L_4$ flow into vaporizer 23 at a 1:1 mole ratio, so that a second ceramic alloy layer containing $M^1$ and $M^2$ in roughly equal amounts is deposited on the first ceramic alloy layer, and then
  adjusted so that $M^1L_4$ and $M^2L_4$ flow into vaporizer 23 at a 1:2 mole ratio, so that a third ceramic alloy layer rich in $M^2$ is deposited on the second ceramic alloy layer.

Thus, the techniques disclosed herein allow deposition of multiple ceramic layers, where the composition of the layers changes in a stepwise fashion.

Figure 10B:
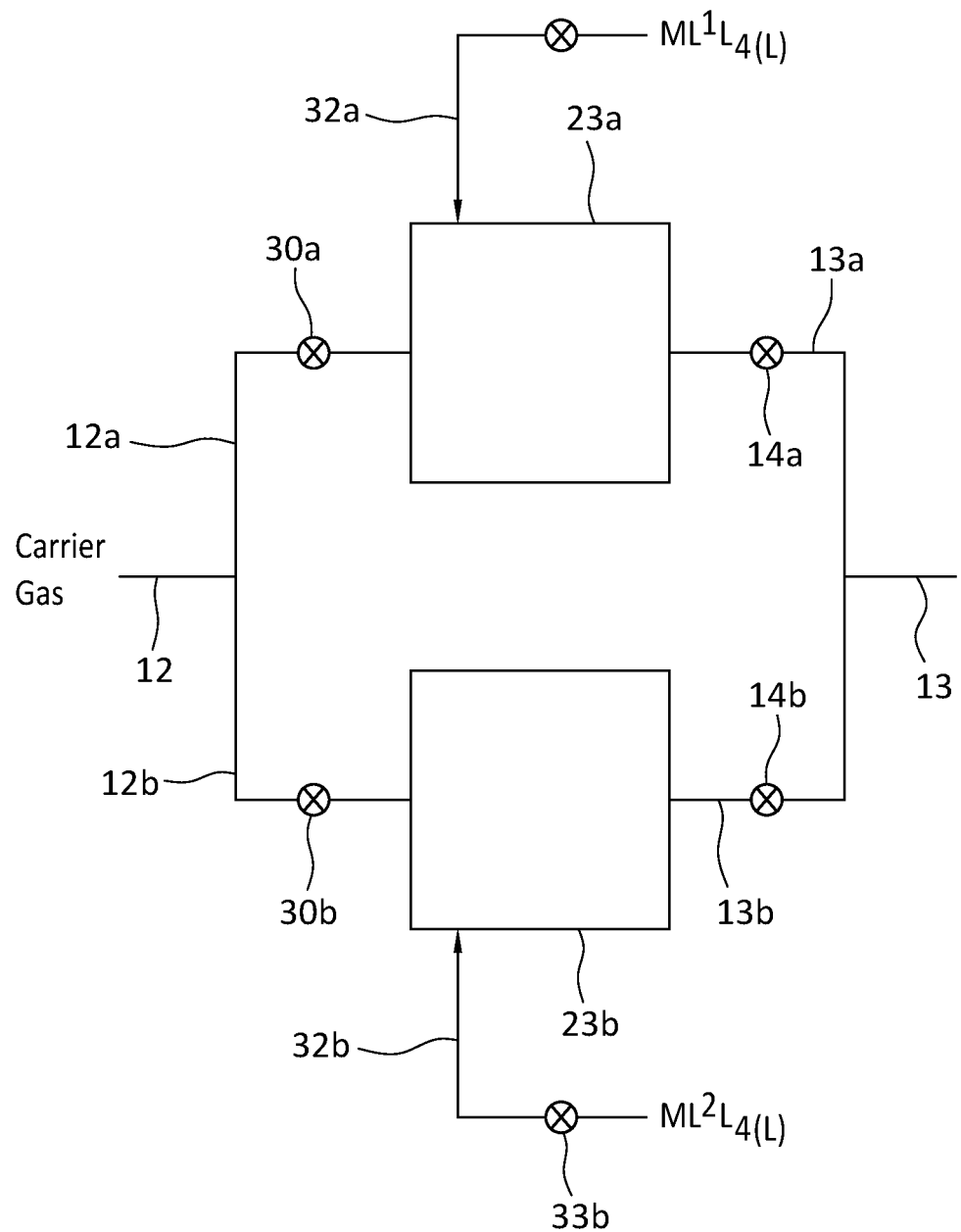
FIG. 10b illustrates a second modification of the vaporizer system for use in the system of FIG. 6, allowing deposition of a ceramic layer containing a mixture of metals.

FIG. 10b shows a second modified version of a vaporizer system for use in the system of FIG. 6. In the system of FIG. 10b, a carrier gas enters a first vaporizer 23a through gas input 12a, with the flow rate of the carrier gas being controlled by valve 30a. A first liquid non-halogenated metal compound, $M^1L_{4(L)}$, is injected into the first vaporizer 23a through input 32a. The carrier gas enters a second vaporizer 23b through gas input 12b, with the flow rate of the carrier gas being controlled by valve 30b. A second liquid non-halogenated metal compound, $M^2L_{4(L)}$, is injected into the second vaporizer 23b through input 32b. The flow rates of the first and second liquid non-halogenated metal compounds are controlled by valves 33a and 33b, respectively. The source of each liquid non-halogenated metal compound may be a system according to FIG. 8 or FIG. 9, as desired.

In vaporizers 23a and 23b, the metal compounds $M^1L_4$ and $M^2L_4$ are vaporized. The carrier gas carries the vaporized metal compound $M^1L_4$ from vaporizer 23a through output 13a. A valve or other mass flow controller 14a controls the rate at which the carrier gas passes through output 13a. Similarly, the carrier gas carries the vaporized metal compound $M^2L_4$ from vaporizer 23b through output 13b, where a valve 14b controls the rate at which the carrier gas passes through output 13b. Outputs 13a and 13b may be combined into passage 13, and the carrier gas then flows to a fluidized bed reactor 19, carrying the vaporized metal compounds, generally as shown in FIG. 6. In various embodiments, valves 33a and 33b may be adjusted so that $M^1L_4$ and $M^2L_4$ flow into vaporizers 23a and 23b, respectively, at a fixed mass ratio, allowing deposition of a ceramic alloy of constant composition in reactor 19. Valves 33a and 33b may be adjusted so that $M^1L_4$ and $M^2L_4$ flow into vaporizers 23a and 23b, respectively, at a variable mass ratio, allowing deposition of a ceramic alloy of variable composition in reactor 19.

Figure 11:
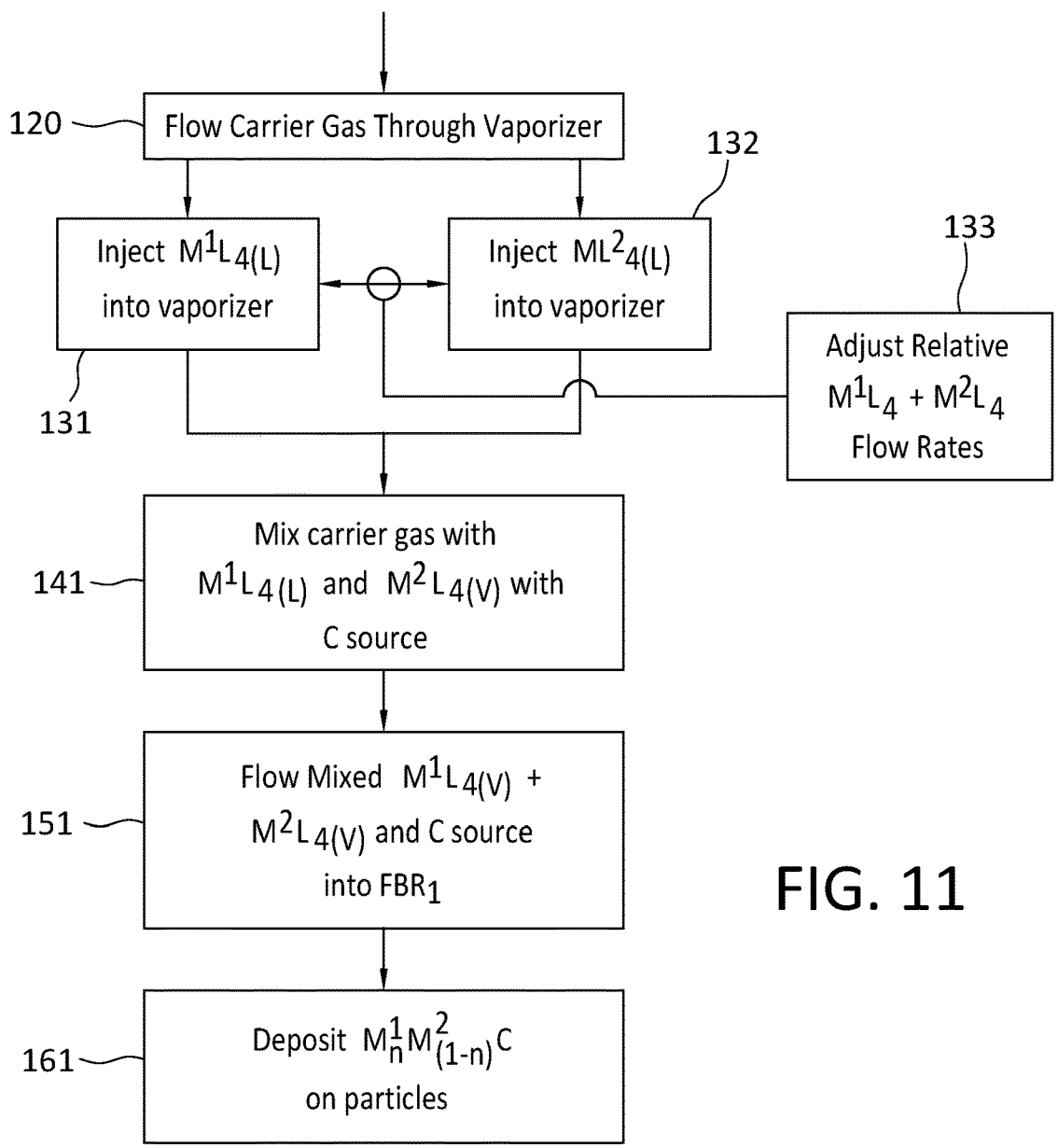
FIG. 11 illustrates a flow chart showing a method for fluidized bed CVD using a mixture of liquid organometallic compounds as a metal precursor for deposition of a ceramic layer containing mixed metals.

FIG. 11 shows a modified flow chart for deposition of a ceramic alloy on particles 21 using the system of FIG. 6, where vaporizer 23 is a vaporizer as shown in FIG. 10a. Steps 100 to 120 are substantially identical to steps 100 to 120 in the flow cart of FIG. 7. In step 120, the flow of a carrier gas through vaporizer 23 is initiated. In step 131, a first liquid metal precursor, $M^1L_{4(L)}$, is injected into vaporizer 23. In step 132, a second liquid metal precursor, $M^2L_{4(L)}$, is injected into vaporizer 23. If desired, the relative flow rate of $M^1L_{4(L)}$ and $M^2L_{4(L)}$ into vaporizer 23 may be adjusted using valves 33a and 33b of FIG. 10a, as shown in step 133. In step 141, the carrier gas leaves vaporizer 23 through outlet 13 carrying a mixture of vaporized metal precursors, $M^1L_{4(vap)}$ and $M^2L_{4(vap)}$, and is mixed with a gaseous carbon, nitrogen, or oxygen source. In step 151, the mixed gas flows into the fluidized bed reactor 19 at operating temperature $T_1$, allowing deposition of a desired ceramic alloy coating, e.g., $M^1{}_nM^2{}_{(1-n)}C$, on particles 21 in step 161.

Figure 12A:
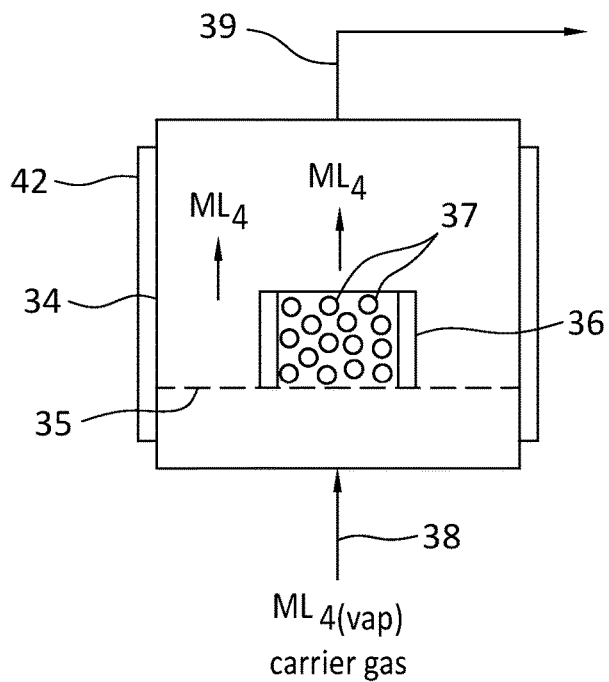
FIGS. 12a and 12b illustrate isobaric chemical vapor infiltration (CVI) reactors.
Figure 12B:
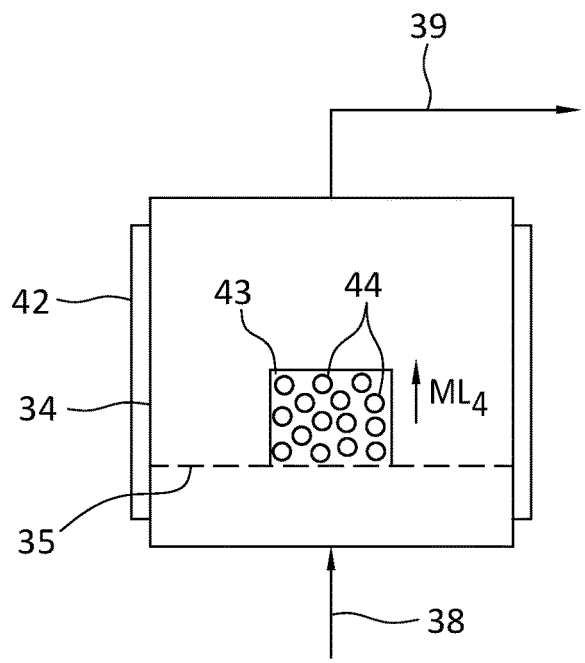

FIGS. 12a and 12b show metal deposition from a vaporized organometallic compound into a porous mass by chemical vapor infiltration. Chemical vapor infiltration uses a system which is similar to the system of FIG. 6, except that a different reactor 34 is used. Reactor 34 includes a gas input 38 which carries a vaporized organometallic deposition precursor $ML_{4(vap)}$, a carrier gas, and optionally a carbon, nitrogen, or oxygen source into reactor 34. Input 34 may receive the vaporized organometallic deposition precursor from a vaporizer 23, substantially as shown in FIG. 6, and may receive the carbon, nitrogen, or oxygen source from sources 16a, 16b, and 16c, substantially as shown in FIG. 6. The fluidized bed reactor 34 is heated with a heat source 42, which may be a resistive heat source.

In FIGS. 12a and 12b, a screen or grid 35 supports a porous mass which serves as a substrate for chemical vapor infiltration. As shown in FIG. 12a, the porous mass comprises particles 37 supported by a mold 36. As shown in FIG. 12a, the organometallic precursor gas, which can be mixed with the carbon, nitrogen, or oxygen source and/or a carrier gas, flows all around the porous mass, with a constant pressure surrounding the sample. This system provides isobaric chemical vapor infiltration, and allows consistent and high-quality growth of a metal or ceramic layer but requires extended processing times and may not uniformly infiltrate the sample. In various embodiments, the porous mass may be a fibrous material, e.g., a felt or mat of carbon or ceramic fibers.

Figure 13:
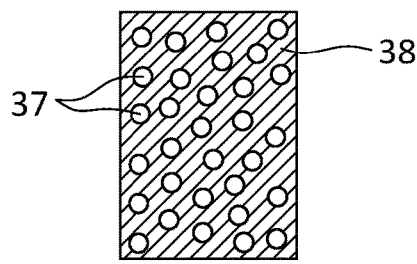
FIG. 13 illustrates a product produced by chemical vapor infiltration (CVI).

As shown in FIG. 12, the carrier gas carries $ML_{4(vap)}$ into the reactor and upwards through the porous mass of particles or fibers 37. The metal or ceramic is deposited in the spaces between particles or fibers 37 to form a consolidated mass. The carrier gas exits the reactor through exhaust 39. The product, after separation from mold 36, is shown in FIG. 13. Particles or fibers 37 are surrounded by a matrix of a deposited metal or ceramic 38. The system of FIG. 12 may also be used to deposit a layer of metal or ceramic 40 on a solid material.

In FIG. 12b, the screen or grid 35 supports a porous mass comprises a self-supporting mass 43 of particles or fibers 44. In various embodiments, the self-supporting mass 43 may comprise a solid mass of sintered particles 44 or a non-woven mass of fibers 44. Sintered particles 44 may be ceramic particles. The non-woven mass of fibers 44 may be a mass of ceramic fibers or carbon fibers. As shown in FIG. 12b, the organometallic precursor gas flows all around the porous mass, with a constant pressure surrounding the sample. This system provides isobaric chemical vapor infiltration into mass 43, and allows consistent and high-quality growth of a metal or ceramic layer. Since mass 43 is self-supporting, no mold is required.

Figure 14:
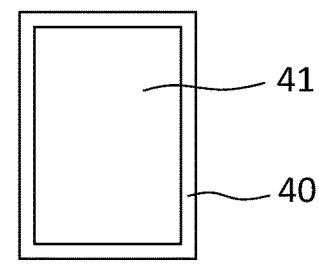
FIG. 14 illustrates a product produced by chemical vapor deposition (CVD) on a bulk material.

The system of FIG. 6 may be used during deposition of a ceramic layer on a TRISO nuclear particle. The system of FIG. 6 may be used during deposition of a ceramic layer on an uncoated nuclear fuel material, such as a uranium oxide or a uranium oxycarbide. The system of FIG. 12b may be used for direct deposition of a metal or ceramic layer 40 onto solid structural nuclear materials or fuel elements 41, as shown in FIG. 14. The system of FIG. 12a may be used for infiltration of a ceramic or metal material into porous nuclear materials, producing fuel particles 37 dispersed into a metallic matrix or a ceramic matrix 38 following removal of mold 36, as shown in FIG. 13.

Figure 15:
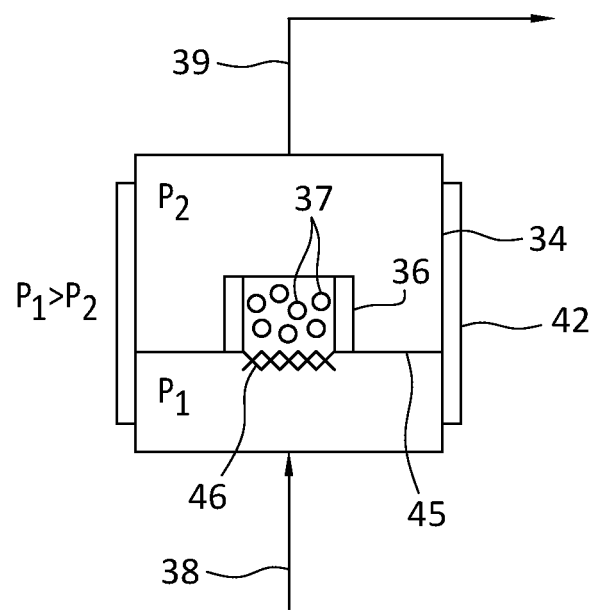
FIG. 15 illustrates a forced-flow chemical vapor infiltration (CVI) reactor.

FIG. 15 shows metal deposition from a vaporized organometallic compound into a porous mass by chemical vapor infiltration, using a forced flow reactor. In FIG. 15, reactor 34 includes a gas input 38 which carries a vaporized organometallic deposition precursor $ML_{4(vap)}$, a carrier gas, and optionally a carbon, nitrogen, or oxygen source into reactor 34. Input 34 may receive the vaporized organometallic deposition precursor from a vaporizer 23, substantially as shown in FIG. 6, and may receive the carbon, nitrogen, or oxygen source from sources 16a, 16b, and 16c, substantially as shown in FIG. 6. The fluidized bed reactor 34 is heated with a heat source 42, which may be a resistive heat source.

Where the isobaric reactor of FIGS. 12a and 12b use a screen or grid 35 which allows gas to flow at constant pressure through reactor 34, the reactor 34 of FIG. 15 is a forced flow reactor, in which the sample is partially sealed against the volume in which precursor gas is injected into the CVI system. As seen in FIG. 15, a porous mass of particles or fibers 37, which may be supported by mold 36, is supported on a gas-permeable support 46. If the porous mass is a self-supporting mass, e.g., a solid mass of sintered particles or a non-woven material, mold 36 may not be required. Support 46 may be supported by a gas-impermeable support 45. This creates a pressure gradient, where the pressure below support 46, $P_1$, is greater than the pressure above support 46, $P_2$. This results in a pressure gradient between the initial volume of the CVI system and the exhausting volume of the CVI system. This resultant pressure gradient, "forces" the precursor through the porous mass of particles or fibers. The advantages to this system are increased penetration into empty volumes/pores of the sample, and increased growth rates of the metal or ceramic material. However, use of a forced flow system may lower the quality of the metal or ceramic materials deposited in the porous mass, as compared to the isobaric system of FIG. 12a. In various embodiments, $P_1$ is greater than or equal to atmospheric pressure, e.g., 1 atm to 5 atm, 1.1 to 4 atm, 1.2 to 3 atm, or 1.3 to 2.5 atm, or 1.35 to 2 atm. In various embodiments, $P_2$ is less than or equal to $P_1$.

A tube furnace chemical vapor deposition reactor may be used to deposit a metal or ceramic coating onto a generally solid, possibly non-porous, material. This may be used for the production of metal or ceramic coatings on nuclear materials. FIG. 15 shows a tube furnace CVD reactor 48 that may coat all surfaces of a sample 47 that are not in contact with the tubular wall of reactor 48. Sample 47 may be a generally homogeneous material, e.g., a solid ceramic, metal, or graphite block. Sample 47 may be a non-homogeneous material, e.g., solid particles or fibers dispersed or distributed within a ceramic, metal, or graphite matrix. Sample 47 may be a non-homogeneous nuclear fuel element, e.g., a nuclear fuel element with TRISO particles distributed within a graphite matrix. This can be advantageous for materials where only specific surfaces are desired to have a metal or ceramic coating layer. Reactor 48 includes a gas input 38 which carries a vaporized organometallic deposition precursor $ML_{4(vap)}$, a carrier gas, and optionally a carbon, nitrogen, or oxygen source into reactor 34. Input 34 may receive the vaporized organometallic deposition precursor from a vaporizer 23, substantially as shown in FIG. 6, and may receive the carbon, nitrogen, or oxygen source from sources 16*a*, 16*b*, and 16*c*, substantially as shown in FIG. 6. The reactor 48 is heated with a heat source 42, which may be a resistive heat source. Within reactor 48, exposed surfaces of sample 47 may be coated with a metal or ceramic layer, and the carrier gas may be recovered through exhaust 39. If it is desired to coat all surfaces of sample 47, reactor 48 may be rotated about its axis by methods known in the art. This causes sample 47 to tumble within reactor 48, so that all surfaces are exposed to the metal or ceramic precursor gases.

Deposition of metal ceramic materials with organometallic precursors can increase the power density, increase the burnup, and improve high temperature applications, as compared to conventional nuclear fuels. Metal ceramic materials produced with organometallic precursors have applications in materials test reactors, isotope production reactors, and reactors developed for both power generation and propulsion in space. Chemical vapor infiltration of a refractory ceramic prepared from an organometallic liquid precursor into a ceramic nonwoven material may produce composite materials of high strength and temperature resistance.

Example 1. Preparation of TRISO Particles

TRISO particles, as shown in FIG. 3, were prepared using a system of FIG. 6. TRISO particles were prepared using uranium dioxide kernels as particles 21, which were placed in a fluidized bed reactor 19, which was resistively heated to a deposition temperature. Liquid ZyALD was used as a zirconium source. Argon was used as a carrier gas. Ethylene and propylene were used as carbon sources.

The fluidized bed reactor was heated to an initial deposition temperature of 1400° C. Argon was used as a carrier gas and combined with ethylene, and the resulting gas mixture flowed into the fluidized bed reactor 19 through input 19. A porous carbon layer, layer 2 of FIG. 3, was deposited on the uranium dioxide kernels, core 1 of FIG. 3.

The temperature of the fluidized bed reactor was reduced to a deposition temperature of 1200° C. to 1350° C. Argon was used as a carrier gas and combined with a mixture of ethylene and propylene as a carbon source, and the resulting gas mixture flowed into the fluidized bed reactor 19 through input 19. An inner pyrolytic carbon layer, layer 3 of FIG. 3, was deposited on the porous carbon layer 2.

The temperature of the fluidized bed reactor was increased to a deposition temperature of 1400° C. to 1500° C. A stream of argon was used as a carrier gas, and flowed into vaporizer 23 of FIG. 6. Liquid ZyALD was injected into vaporizer 23 as a zirconium source, and a mixture of argon and vaporized ZyALD exited the vaporizer through exit 13. The ZyALD/argon mixture was combined with ethylene as a carbon source. The resulting gas mixture containing ZyALD and ethylene flowed into the fluidized bed reactor 19 through input 19. A ceramic zirconium carbide layer, layer 4 of FIG. 3, was deposited on the inner pyrolytic carbon layer 3.

Following deposition of the ceramic layer, the temperature of the fluidized bed reactor was reduced to a deposition temperature of 1200° C. to 1350° C. Flow of ZyALD to reactor 19 was ceased. The carrier gas argon was combined with a mixture of ethylene and propylene as a carbon source, and the resulting gas mixture flowed into the fluidized bed reactor 19 through input 19. An outer pyrolytic carbon layer, layer 5 of FIG. 3, was deposited on the ceramic zirconium carbide layer 4, completing formation of the desired TRISO particles.

Example 2. Preparation of TRISO Particles with Ceramic Multilayers

TRISO particles, as shown in FIG. 3, were prepared using a system of FIG. 6. TRISO particles were prepared using uranium dioxide kernels as particles 21, which were placed in a fluidized bed reactor 19, which was resistively heated to a deposition temperature. Liquid ZyALD was used as a zirconium source. Argon was used as a carrier gas. Ethylene and propylene were used as carbon sources.

The fluidized bed reactor was heated to an initial deposition temperature of 1400° C. Argon was used as a carrier gas and combined with ethylene, and the resulting gas mixture flowed into the fluidized bed reactor 19 through input 19. A porous carbon layer, layer 2 of FIG. 3, was deposited on the uranium dioxide kernels, core 1 of FIG. 3.

The temperature of the fluidized bed reactor was reduced to a deposition temperature of 1200° C. to 1350° C. Argon was used as a carrier gas and combined with a mixture of ethylene and propylene as a carbon source, and the resulting gas mixture flowed into the fluidized bed reactor 19 through input 19. An inner pyrolytic carbon layer, layer 3 of FIG. 3, was deposited on the porous carbon layer 2.

The temperature of the fluidized bed reactor was increased to a deposition temperature of 1400° C. to 1500° C. A stream of argon was used as a carrier gas, and flowed into vaporizer 23 of FIG. 6. Liquid ZyALD was injected into vaporizer 23 as a zirconium source, and a mixture of argon and vaporized ZyALD exited the vaporizer through exit 13. The ZyALD/argon mixture was combined with ethylene as a carbon source. The resulting gas mixture containing ZyALD and ethylene flowed into the fluidized bed reactor 19 through input 19. A ceramic zirconium carbide layer, layer 4 of FIG. 3, was deposited on the inner pyrolytic carbon layer 3. The mol ratio of ZyALD to ethylene was adjusted using valves 17*c* and 14 of FIG. 6. The initial mol ratio of ZyALD to ethylene was 1:2. This was subsequently increased to a mol ratio of 1:1, and then to 2:1. The resulting ceramic zirconium carbide layer 4 was a trilayer, with a carbon-rich inner layer and a zirconium-rich outer layer.

Following deposition of the ceramic trilayer, the temperature of the fluidized bed reactor was reduced to a deposition temperature of 1200° C. to 1350° C. Flow of ZyALD to reactor 19 was ceased. The carrier gas argon was combined with a mixture of ethylene and propylene as a carbon source, and the resulting gas mixture flowed into the fluidized bed reactor 19 through input 19. An outer pyrolytic carbon layer, layer 5 of FIG. 3, was deposited on the ceramic zirconium carbide layer 4, completing formation of the desired TRISO particles.

Example 3. Preparation of TRISO Particles with Ceramic Multilayers

TRISO particles, as shown in FIG. 3, were prepared using a system of FIG. 6, modified to include a vaporizer according to FIG. 10*a*. TRISO particles were prepared using uranium dioxide kernels as particles 21, which were placed in a fluidized bed reactor 19, which was resistively heated to a deposition temperature. Liquid ZyALD was used as a zirconium source. Bis(methylimino)-bis(dimethylamino) tungsten(VI) was used as a tungsten source. Argon was used as a carrier gas. Ethylene and propylene were used as carbon sources.

The fluidized bed reactor was heated to an initial deposition temperature of 1400° C. Argon was used as a carrier gas and combined with ethylene, and the resulting gas mixture flowed into the fluidized bed reactor 19 through input 19. A porous carbon layer, layer 2 of FIG. 3, was deposited on the uranium dioxide kernels, core 1 of FIG. 3.

The temperature of the fluidized bed reactor was reduced to a deposition temperature of 1200° C. to 1350° C. Argon was used as a carrier gas and combined with a mixture of ethylene and propylene as a carbon source, and the resulting gas mixture flowed into the fluidized bed reactor 19 through input 19. An inner pyrolytic carbon layer, layer 3 of FIG. 3, was deposited on the porous carbon layer 2.

The temperature of the fluidized bed reactor was increased to a deposition temperature of 1400° C. to 1500° C. A stream of argon was used as a carrier gas, and flowed into vaporizer 23 of FIG. 6. Liquid ZyALD was injected into vaporizer 23 as a zirconium source through input 32a, and liquid bis(methylimino)bis(dimethylamino)tungsten(VI) was injected into vaporizer 23 as a tungsten source through input 32b. A mixture of argon, vaporized ZyALD, and the vaporized tungsten source exited the vaporizer through exit 13. The ZyALD/tungsten source/argon mixture was combined with ethylene as a carbon source. The resulting gas mixture flowed into the fluidized bed reactor 19 through input 19. A ceramic zirconium tungsten carbide layer, layer 4 of FIG. 3, was deposited on the inner pyrolytic carbon layer 3.

At the start of deposition of layer 4, valves 33a and 33b were used to adjust the relative flow rate of ZyALD and bis(methylimino)bis(dimethylamino)tungsten(VI) so that they entered the vaporizer at a mol ratio of 2:1. A zirconium-rich zirconium tungsten carbide layer was deposited on the pyrolytic carbon layer 3. Later, valves 33a and 33b were used to adjust the relative flow rate of ZyALD and bis(methylimino)bis(dimethylamino)tungsten(VI) so that they entered the vaporizer at a mol ratio of 1:2, and a tungsten-rich zirconium tungsten carbide layer was deposited, forming a ceramic bilayer.

Following deposition of the ceramic layer, the temperature of the fluidized bed reactor was reduced to a deposition temperature of 1200° C. to 1350° C. Flow of ZyALD to reactor 19 was ceased. The carrier gas argon was combined with a mixture of ethylene and propylene as a carbon source, and the resulting gas mixture flowed into the fluidized bed reactor 19 through input 19. An outer pyrolytic carbon layer, layer 5 of FIG. 3, was deposited on the ceramic zirconium carbide layer 4, completing formation of the desired TRISO particles.

Example 4. Preparation of a Composite Containing Carbon Fibers in a Zirconium Carbide Matrix A composite containing carbon fibers in a zirconium carbide matrix may be prepared using a system of FIG. 12a, including a vaporizer according to FIG. 6. A carbon fiber felt containing fibers 37 may be placed on screen 35 in chemical vapor infiltration reactor 34, which is resistively heated to a deposition temperature. Liquid ZyALD may be used as a zirconium source. Argon may be used as a carrier gas. Ethylene and propylene may be used as carbon sources.

The temperature of the chemical vapor infiltration reactor 34 is increased to a deposition temperature of 1400° C. to 1500° C. A stream of argon is used as a carrier gas, and flows into vaporizer 23 of FIG. 6. Liquid ZyALD is injected into vaporizer 23 as a zirconium source through input 32. A mixture of argon and vaporized ZyALD exits the vaporizer through exit 13. The ZyALD/argon mixture is combined with ethylene as a carbon source. The resulting gas mixture flows into the chemical vapor infiltration reactor 34 through input 38. A ceramic zirconium carbide is deposited in the spaces between fibers 38 of the carbon fiber felt, forming matrix 38 of FIG. 13 around fibers 37.

Example 5. Deposition of Zirconium Carbide on a Graphite Substrate

Figure 16:
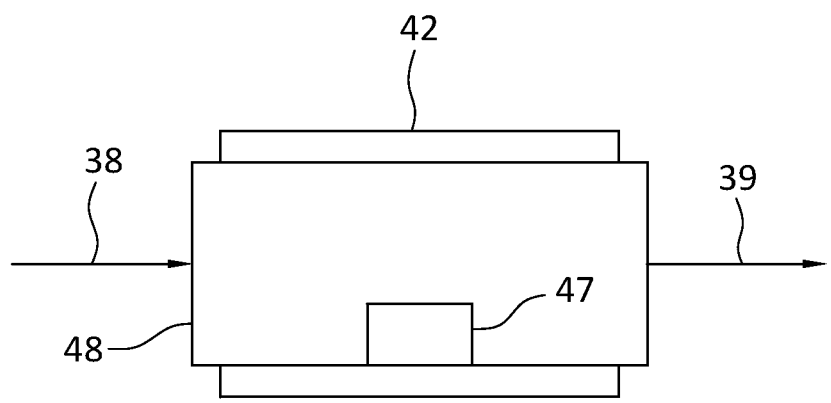
FIG. 16 illustrates a tubular chemical vapor deposition (CVD) reactor.

A coated graphite block may be prepared using a system of FIG. 16, including a vaporizer according to FIG. 6. A graphite ingot block 47 having a size of 100 mm×50 mm×25 mm and a purity of 99.9% may be placed in chemical vapor deposition reactor 48, which is resistively heated to a deposition temperature. Reactor 48 may be rotated about its axis to cause sample 47 to tumble within reactor 48. Liquid ZyALD may be used as a zirconium source. Argon may be used as a carrier gas. Ethylene and propylene may be used as carbon sources.

The temperature of the chemical vapor deposition reactor 48 is increased to a deposition temperature of 1400° C. to 1500° C. A stream of argon is used as a carrier gas, and flows into vaporizer 23 of FIG. 6. Liquid ZyALD is injected into vaporizer 23 as a zirconium source through input 32. A mixture of argon and vaporized ZyALD exits the vaporizer through exit 13. The ZyALD/argon mixture is combined with ethylene as a carbon source. The resulting gas mixture flows into the chemical vapor deposition reactor 48 through input 38. A ceramic zirconium carbide layer is deposited in on the outer surface of the graphite ingot block 47, forming a zirconium carbide layer on ingot block 47.

Example 6. Deposition of Zirconium Carbide on a Nuclear Fuel Element

A coated nuclear fuel element may be prepared using a system of FIG. 16, including a vaporizer according to FIG. 6. A nuclear fuel element 47 containing TRISO particles in a graphite matrix may be placed in chemical vapor deposition reactor 48, which is resistively heated to a deposition temperature. Reactor 48 may be rotated about its axis to cause nuclear fuel element 47 to tumble within reactor 48. Liquid ZyALD may be used as a zirconium source. Argon may be used as a carrier gas. Ethylene and propylene may be used as carbon sources.

The temperature of the chemical vapor deposition reactor 48 is increased to a deposition temperature of 1400° C. to 1500° C. A stream of argon is used as a carrier gas, and flows into vaporizer 23 of FIG. 6. Liquid ZyALD is injected into vaporizer 23 as a zirconium source through input 32. A mixture of argon and vaporized ZyALD exits the vaporizer through exit 13. The ZyALD/argon mixture is combined with ethylene as a carbon source. The resulting gas mixture flows into the chemical vapor deposition reactor 48 through input 38. A ceramic zirconium carbide layer is deposited in on the outer surface of the nuclear fuel element 47, forming a zirconium carbide layer on nuclear fuel element 47. The resulting nuclear fuel element has a structure generally corresponding to FIG. 14, where a zirconium carbide layer 40 has been deposited onto a solid bulk material 41. In this example, the solid bulk material 41 comprises a graphite matrix, and TRISO particles dispersed within the solid graphite matrix.

CONCLUSION

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A method of depositing a metal or ceramic layer comprising a metal selected from the group consisting of Zr, Hf, Nb, Ta, W, V, Ti, and mixtures thereof by chemical vapor deposition, comprising:
   a. introducing particles to a fluidized bed reactor, wherein the particles comprise nuclear fuel kernels;
   b. heating the fluidized bed reactor to a desired operating temperature $T_1$;
   c. initiating a flow of a carrier gas through a vaporizer;
   d. injecting a non-halogenated liquid organometallic metal precursor into the vaporizer and vaporizing the non-halogenated liquid organometallic metal precursor, wherein the non-halogenated liquid organometallic metal precursor is a compound of the metal selected from the group consisting of Zr, Hf, Nb, Ta, W, V, Ti, and mixtures thereof;
   e. allowing a first mixture of the carrier gas and the vaporized non-halogenated liquid organometallic metal precursor to leave the vaporizer;
   f. optionally mixing the first mixture with a gaseous carbon source, a gaseous nitrogen source, a gaseous oxygen source, or a mixture thereof to produce a second mixture; and
   g. either:
      causing the first mixture to flow into the fluidized bed reactor at operating temperature $T_1$, allowing deposition of a desired metal coating on the particles; or
      causing the second mixture to flow into the fluidized bed reactor at operating temperature $T_1$, allowing deposition of a desired ceramic coating on the particles.

2. The method of claim 1, wherein the particles are nuclear fuel kernels selected from the group consisting of oxides, carbides, oxycarbides, and nitrides of a metal selected from the group consisting of uranium, plutonium, and thorium, and mixtures thereof.

3. The method of claim 1, wherein the particles are nuclear fuel kernels selected from the group consisting of uranium oxides, uranium carbide, uranium nitrides, uranium oxycarbide, and mixtures thereof.

4. The method of claim 1, wherein the nuclear fuel kernels comprise:
   a core of a ceramic uranium material, a ceramic plutonium material, a ceramic thorium material, or a mixture thereof; and
   at least one coating of porous or non-porous pyrolytic carbon.

5. The method of claim 1, wherein each particle comprises a nuclear fuel kernel, a porous carbon buffer layer on the kernel, and a dense layer of pyrolytic carbon on the buffer layer.

6. The method of claim 1, wherein:
   step (g) is the step of causing the second mixture to flow into the fluidized bed reactor; and
   the method further comprises:
      a step of depositing an inner carbon layer on the nuclear fuel kernels, prior to step (d); and
      a step of depositing an outer carbon layer on the desired ceramic coating.

7. The method of claim 1, wherein the non-halogenated liquid organometallic metal precursor has a formula $M^{+n}L_n$, $M^{+n}L^1_{(n-m)}L^2_{(m)}$, or $(L_3=)_pM^{+n}L_{(n-2p)}$, wherein:
   M is Zr, Hf, Nb, Ta, W, V, Ti, or a mixture thereof;
   L and $L^1$ are independently selected from C1-C4 alkyl groups, C1-C4 alkoxy groups, bis(C1-C4 dialkyl) amido groups, or a combination thereof;
   $L^2$ is a cyclopentadienyl anion;
   $L^3$ is O= or RN=, wherein R is alkyl;
   m is 1 or 2,
   p is 1 or 2, and
   n is the valency of the metal M.

8. The method of claim 1, wherein the non-halogenated liquid organometallic metal precursor is:
   a metal alkoxide selected from the group consisting of titanium(IV) isopropoxide, titanium(IV) isobutoxide, hafnium(IV) butoxide, niobium(V) t-butoxide, niobium(III) t-butoxide, and zirconium(IV) butoxide; or
   a metal amine selected from the group consisting of:
      (tert-butylimino)tris(diethylamino)tantalum(V);
      (tert-butylimino)tris(diethylamino)niobium(V);
      (tert-butylimino)tris(methylethylamino)niobium(V);
      tris(diethylamino)niobium(III);
      tris(methylethylamino)niobium(III);
      tris(diethylamino)niobium(III);
      tris(dimethylamino)cyclopentadienyl zirconium(IV);
      tetrakis(isopropylmethylamino)zirconium(IV);
      tetrakis(ethylmethylamino)zirconium(IV);
      tetrakis(diethylamino)zirconium(IV);
      tris(dimethylamino)cyclopentadienyl hafnium(IV);
      bis(methylimino)bis(dimethylamino)tungsten(VI); and
      bis(tert-butylimino)bis(dimethylamino)tungsten(VI).

9. The method of claim 1, wherein:
   step (f) comprises mixing the first mixture with the gaseous carbon source to produce the second mixture; and
   step (g) comprises causing the second mixture to flow into the fluidized bed reactor at operating temperature $T_1$, allowing deposition of a desired metal carbide coating on the particles.

10. The method of claim 9, wherein the gaseous carbon source is methane, ethane, ethylene, propylene, acetylene, natural gas, or a mixture thereof.

11. The method of claim 1, wherein:
    step (f) comprises mixing the first mixture with the gaseous nitrogen source to produce the second mixture; and
    step (g) comprises causing the second mixture to flow into the fluidized bed reactor at operating temperature $T_1$, allowing deposition of a desired metal nitride coating on the particles.

12. The method of claim 11, wherein the gaseous nitrogen source is nitrogen gas, ammonia, or a mixture thereof.

13. The method of claim 1, wherein:
    step (f) comprises mixing the first mixture with the gaseous oxygen source to produce the second mixture; and
    step (g) comprises causing the second mixture to flow into the fluidized bed reactor at operating temperature $T_1$, allowing deposition of a desired metal oxide coating on the particles.

14. The method of claim 13, wherein the gaseous oxygen source is ozone, oxygen, nitric oxide, nitrous oxide, or a mixture thereof.

15. A method of depositing a metal or ceramic layer by chemical vapor deposition, comprising:
- a. introducing nuclear fuel kernels to a fluidized bed reactor;
- b. heating the fluidized bed reactor to a desired operating temperature $T_1$;
- c. initiating a flow of a carrier gas through a vaporizer;
- d. injecting a non-halogenated liquid organometallic metal precursor into the vaporizer and vaporizing the non-halogenated liquid organometallic metal precursor;
- e. allowing a first mixture of the carrier gas and the vaporized non-halogenated liquid organometallic metal precursor to leave the vaporizer;
- f. optionally mixing the first mixture with a gaseous carbon source, a gaseous nitrogen source, a gaseous oxygen source, or a mixture thereof to produce a second mixture; and
- g. either:
  - causing the first mixture to flow into the fluidized bed reactor at operating temperature $T_1$, allowing deposition of a desired metal coating on the nuclear fuel kernels; or
  - causing the second mixture to flow into the fluidized bed reactor at operating temperature $T_1$, allowing deposition of a desired ceramic coating on the nuclear fuel kernels.

16. The method of claim 15, wherein the nuclear fuel kernels comprise:
- a core of a ceramic uranium material, a ceramic plutonium material, a ceramic thorium material, or a mixture thereof; and
- at least one coating of porous or non-porous pyrolytic carbon.

\* \* \* \* \*